United States Patent
Misaki et al.

(10) Patent No.: US 10,811,449 B2
(45) Date of Patent: Oct. 20, 2020

(54) ACTIVE MATRIX SUBSTRATE AND X-RAY IMAGING PANEL INCLUDING SAME

(71) Applicant: Sharp Kabushiki Kaisha, Sakai, Osaka (JP)

(72) Inventors: Katsunori Misaki, Yonago (JP); Kunio Matsubara, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/362,802

(22) Filed: Mar. 25, 2019

(65) Prior Publication Data

US 2019/0296065 A1 Sep. 26, 2019

(30) Foreign Application Priority Data

Mar. 26, 2018 (JP) .................. 2018-058277

(51) Int. Cl.
*H01L 27/14* (2006.01)
*H01L 27/146* (2006.01)
*G01T 1/20* (2006.01)

(52) U.S. Cl.
CPC ...... *H01L 27/14618* (2013.01); *G01T 1/2018* (2013.01); *H01L 27/14663* (2013.01); *H01L 27/14689* (2013.01)

(58) Field of Classification Search
CPC ......... H01L 27/14618; H01L 27/14663; G01T 1/2018
See application file for complete search history.

(56) References Cited

U.S. PATENT DOCUMENTS 6,465,861 B1 * 10/2002 Liu .................. H01L 27/14603
257/444
2016/0356645 A1 * 12/2016 Yoneda ................. H04N 5/144

FOREIGN PATENT DOCUMENTS

JP 2007-165865 A 6/2007
JP 2015-119113 A 6/2015

* cited by examiner

*Primary Examiner* — Hugh Maupin
(74) *Attorney, Agent, or Firm* — Keating & Bennett, LLP

(57) ABSTRACT

Provided is a technique to prevent decreases in the detection accuracy caused by leakage current of photoelectric conversion elements that is caused by permeation of moisture. An active matrix substrate 1 includes a plurality of pixels, each of which includes: a photoelectric conversion element 12 that includes a pair of electrodes 14a, 14b and a semiconductor layer 15 interposed between the electrodes 14a, 14b; an inorganic film 105a that covers a part of a surface of one electrode 14b of the pair of electrodes, and a side surface of the photoelectric conversion element 12; a protection film 105b that has corrosion resistance against moisture, and covers a part of the inorganic film 105a that overlaps with the side surface of the photoelectric conversion element 12; and an organic film 106 that covers the inorganic film 105a and the protection film 105b.

7 Claims, 20 Drawing Sheets

ACTIVE MATRIX SUBSTRATE AND X-RAY IMAGING PANEL INCLUDING SAME

TECHNICAL FIELD

The present invention relates to an active matrix substrate, and an X-ray imaging panel including the same.

BACKGROUND ART

Photoelectric conversion devices have been known commonly, such a photoelectric conversion device including an active matrix substrate having pixels that is provided with photoelectric conversion elements each of which is connected with a switching element. Patent Document JP-A-2007-165865 discloses such a photoelectric conversion device. This photoelectric conversion device includes thin film transistors as switching elements, and includes photodiodes as photoelectric conversion elements. In the photodiode, a p-type semiconductor layer, an i-type semiconductor layer, and an n-type semiconductor layer are used as semiconductor layers, and each the p-type semiconductor layer and the n-type semiconductor layer is connected with an electrode. The photodiode is covered with a resin film made of an epoxy resin.

Incidentally, after an imaging panel is produced, a surface of the imaging panel is scarred in some cases. If moisture in the atmosphere gets in the inside through scars of the imaging panel surface, leakage current in semiconductor layers of photodiodes tends to flow between electrodes. For example, in the imaging panel shown in FIG. 8A, moisture gets in the inside through a scar J occurring to the imaging panel surface, moisture permeates the resin film 22 on the photodiode 12. FIG. 8B is an enlarged view showing a part of a broken line frame 210 shown in FIG. 8A. In a case where the electrode 121a protrudes toward an outer side of the X semiconductor layer 122 (in the X-axis direction) with respect to the semiconductor layer 122 as shown in FIGS. 8A and 8B, an inorganic film 21 covering the surface of the photodiode 12 tends to be discontinuous in a part where the electrode 121a protrudes. If moisture permeating the resin film 22 gets in the inside through a part 2101 where the inorganic film 21 is discontinuous, leakage current of the semiconductor layer 122 tends to flow between the electrodes 121a and 121b, which results in that X-ray detection accuracy decreases.

It is an object of the present invention to provide a technique that enables to eliminate decreasing in the detection accuracy caused by leakage current of photoelectric conversion elements that is caused by permeation of moisture.

SUMMARY OF THE INVENTION

To achieve the above object, an aspect of the present invention provides an active matrix substrate that includes a plurality of pixels, wherein each of the pixels includes: a photoelectric conversion element that includes a pair of electrodes, and a semiconductor layer interposed between the pair of electrodes; an inorganic film that covers a part of a surface of one electrode of the pair of electrodes, and a side surface of the photoelectric conversion element; a protection film that has corrosion resistance against moisture, and covers a part of the inorganic film that overlaps with the side surface of the photoelectric conversion element; and an organic film that covers the inorganic film and the protection film.

The active matrix substrate prevents decreases in the detection accuracy, caused by leakage current of photoelectric conversion elements occurring due to permeation of moisture.

BRIEF DESCRIPTION OF DRAWINGS

FIG. 5O is a cross-sectional view showing a step of forming a metal film as a bias line shown in FIG. 4.

MODE FOR CARRYING OUT THE INVENTION

Figure 1:
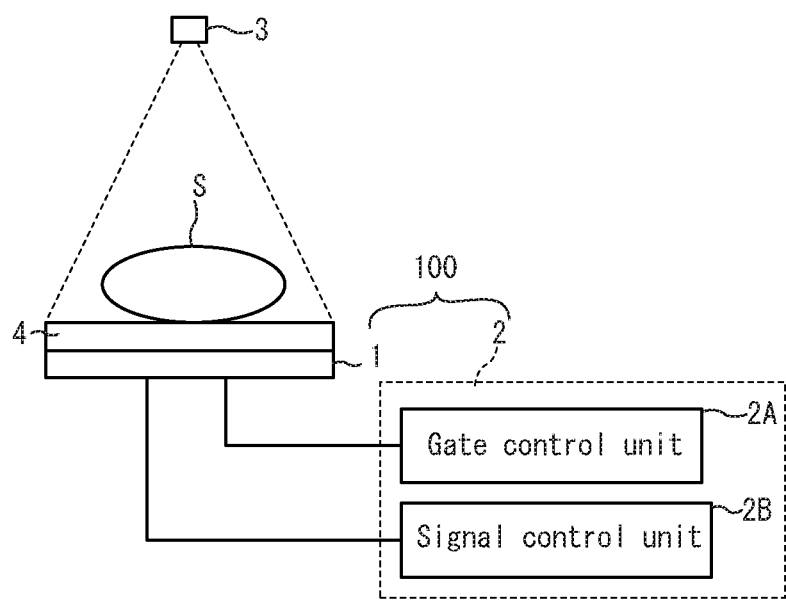
FIG. 1 schematically shows an X-ray imaging device in Embodiment 1.

An active matrix substrate according to one embodiment of the present invention includes a plurality of pixels, each of the pixels includes: a photoelectric conversion element that includes a pair of electrodes, and a semiconductor layer interposed between the pair of electrodes; an inorganic film that covers a part of a surface of one electrode of the pair of electrodes, and a side surface of the photoelectric conversion element; a protection film that has corrosion resistance against moisture, and covers a part of the inorganic film that overlaps with the side surface of the photoelectric conversion element; and an organic film that covers the inorganic film and the protection film (the first configuration).

According to the first configuration, the photoelectric conversion element includes a pair of electrodes, and a semiconductor layer interposed between the pair of electrodes. In the photoelectric conversion element, a part of a surface of one electrode of the pair of electrodes, and a side surface of the photoelectric conversion element are covered with an inorganic film. Further, a protection film that has corrosion resistance against moisture is provided on a part of the inorganic film that overlaps with the side surface of the photoelectric conversion element, and the inorganic film and the protection film are covered with an organic film. In other words, on the side surface of the photoelectric conversion element, the inorganic film and the protection film are laminated. Therefore, supposing a case where there is a discontinuous part in the inorganic film covering the side surface of the photoelectric conversion element, even if moisture permeates the organic film, the protection film makes it unlikely that moisture would get into the discontinuous part of the inorganic film. As a result, it is unlikely that leakage current of the photoelectric conversion element would flow, whereby it is unlikely that detection accuracy would decrease.

The first configuration may be further characterized in that an end of the other one electrode of the pair of electrodes protrudes with respect to a side surface of the semiconductor layer (the second configuration).

According to the second configuration, the other electrode protrudes with respect to the side surface of the photoelectric conversion element, which causes the inorganic film covering the side surface of the photoelectric conversion element to tend to be discontinuous. As the inorganic film and the protection film are laminated on the side surface of the photoelectric conversion element, however, even if moisture permeates from the organic film, the protection film makes it unlikely that the moisture would get into the discontinuous part of the inorganic film.

The first or second configuration may be further characterized in that the surface of the one electrode of the pair of electrodes in the photoelectric conversion element is a light incidence surface, and the protection film does not overlap with the one electrode of the pair of electrodes in the photoelectric conversion element when viewed in a plan view (the third configuration).

According to the third configuration, the protection film is not provided on the incidence surface of the photoelectric conversion element, which makes it possible to eliminate leakage current of the photoelectric conversion element, without reducing the transmittance.

Any one of the first to third configurations may be further characterized in that the inorganic film is provided continuously over a plurality of pixels, and the protection film is provided continuously over the inorganic film provided over the plurality of pixels (the fourth configuration).

According to the fourth configuration, the inorganic film is provided continuously among a plurality of pixels, and the protection film is also provided continuously over the inorganic film provided among the plurality of pixels. Therefore, even if moisture permeates from the organic film, it is unlikely that the moisture would get in through the interface between the protection film and the inorganic film. Thus, leakage current of the photoelectric conversion element can be prevented more efficiently.

Any one of the first to fourth configurations may be further characterized in that the protection film is made of a conductive material (the fifth configuration).

Any one of the first to fourth configurations may be further characterized in that the protection film is made of an insulating material (the sixth configuration).

An imaging panel according to one embodiment of the present invention includes the active matrix substrate according to any one of the first to sixth configurations; and a scintillator that convers irradiated X-rays into scintillation light (the seventh configuration).

According to the seventh configuration, in the active matrix substrate, on the side surface of the photoelectric conversion element, the inorganic film and the protection film are laminated. Therefore, supposing a case where there is a discontinuous part in the inorganic film covering the side surface of the photoelectric conversion element, even if moisture permeates into the organic film, the protection film makes it unlikely that moisture would get into the discontinuous part of the inorganic film. As a result, it is unlikely that leakage current of the photoelectric conversion element would flow, whereby it is unlikely that accuracy of detection of scintillation light obtained by conversion in the scintillator would decrease.

The following description describes embodiments of the present invention in detail, while referring to the drawings. Identical or equivalent parts in the drawings are denoted by the same reference numerals, and the descriptions of the same are not repeated.

Embodiment 1

Configuration

FIG. 1 schematically showing an X-ray imaging device to which an active matrix substrate of the present embodiment is applied. The X-ray imaging device 100 includes an active matrix substrate 1 and a control unit 2. The control unit 2 includes a gate control unit 2A and a signal reading unit 2B. X-rays are emitted from an X-ray source 3 to an object S. X-rays transmitted through the object S are converted into fluorescence (hereinafter referred to as scintillation light) by a scintillator 4 provided on the active matrix substrate 1. The X-ray imaging device 100 generates an X-ray image by picking up scintillation light with use of the active matrix substrate 1 and the control unit 2.

Figure 2:
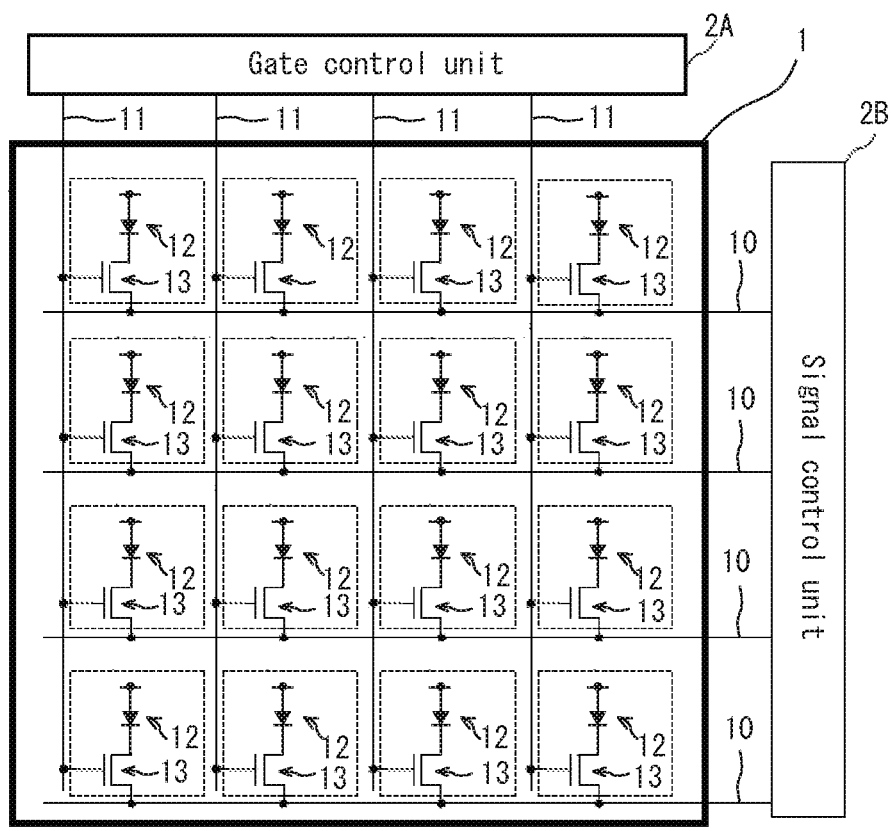
FIG. 2 schematically shows a schematic configuration of an active matrix substrate in FIG. 1.

FIG. 2 schematically shows a schematic configuration of the active matrix substrate 1. As shown in FIG. 2, a plurality of source lines 10, and a plurality of gate lines 11 that intersect with the source lines 10, are formed on the active matrix substrate 1. The gate lines 11 are connected with the gate control unit 2A, and the source lines 10 are connected with the signal reading unit 2B.

The active matrix substrate 1 includes TFTs 13 connected to the source lines 10 and the gate lines 11, at positions where the source lines 10 and the gate lines 11 intersect. Further, in areas surrounded by the source lines 10 and the gate lines 11 (hereinafter referred to as pixels), photodiodes 12 are provided, respectively. In each pixel, the photodiode 12 convers scintillation light obtained by converting X-rays transmitted through the object S, into charges in accordance with the amount of the light.

The gate lines 11 on the active matrix substrate 1 are sequentially switched by the gate control unit 2A into a selected state, and the TFT 13 connected to the gate line 11 in the selected state is turned ON. When the TFT 13 is turned ON, a signal obtained by conversion in the photodiode 12 according to the charges is output to the signal reading unit 2B through the source line 10.

Figure 3:
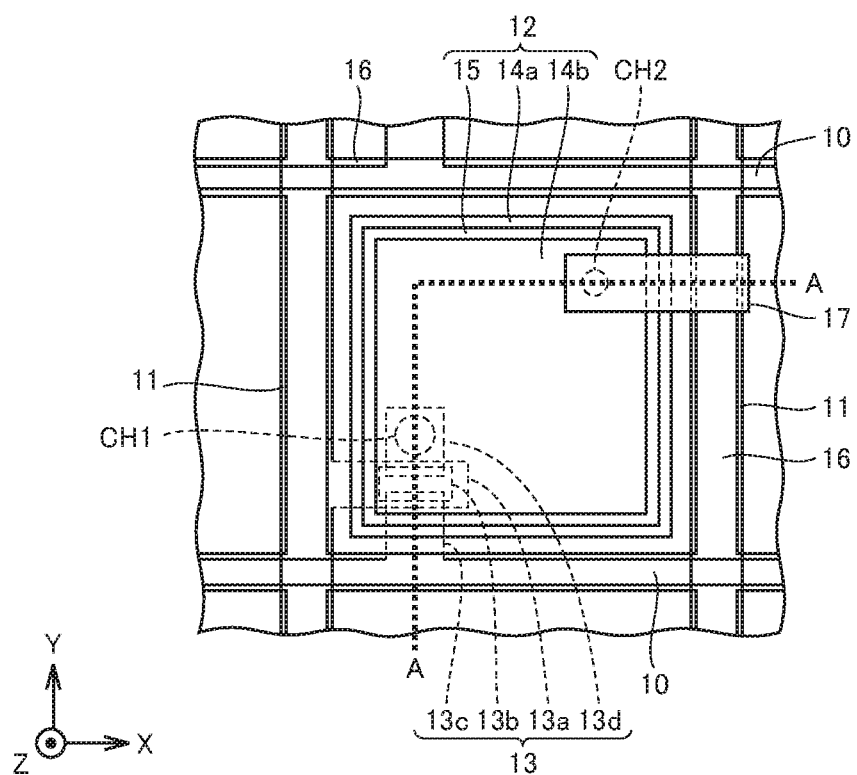
FIG. 3 is an enlarged plan view showing a part of a pixel part of the active matrix substrate shown in FIG. 2 in which pixels are provided.

FIG. 3 is an enlarged plan view showing a part of a pixel part of the active matrix substrate 1 shown in FIG. 2 in which pixels are provided.

As shown in FIG. 3, the pixel surrounded by the gate lines 11 and the source lines 10 has the photodiode 12 and the TFT 13.

The photodiode 12 includes a lower electrode 14a, a photoelectric conversion layer 15, and an upper electrode 14b. The TFT 13 includes a gate electrode 13a integrated with the gate line 11, a semiconductor activity layer 13b, a source electrode 13c integrated with the source line 10, and a drain electrode 13d. The drain electrode 13d and the lower electrode 14a are connected with each other via a contact hole CH1.

Further, a bias line 16 is arranged so as to overlap with the gate line 11 and the source line 10 when viewed in a plan view. The bias line 16 is connected with a transparent conductive film 17. The transparent conductive film 17 supplies a bias voltage to the photodiode 12 via a contact holes CH2.

Figure 4:
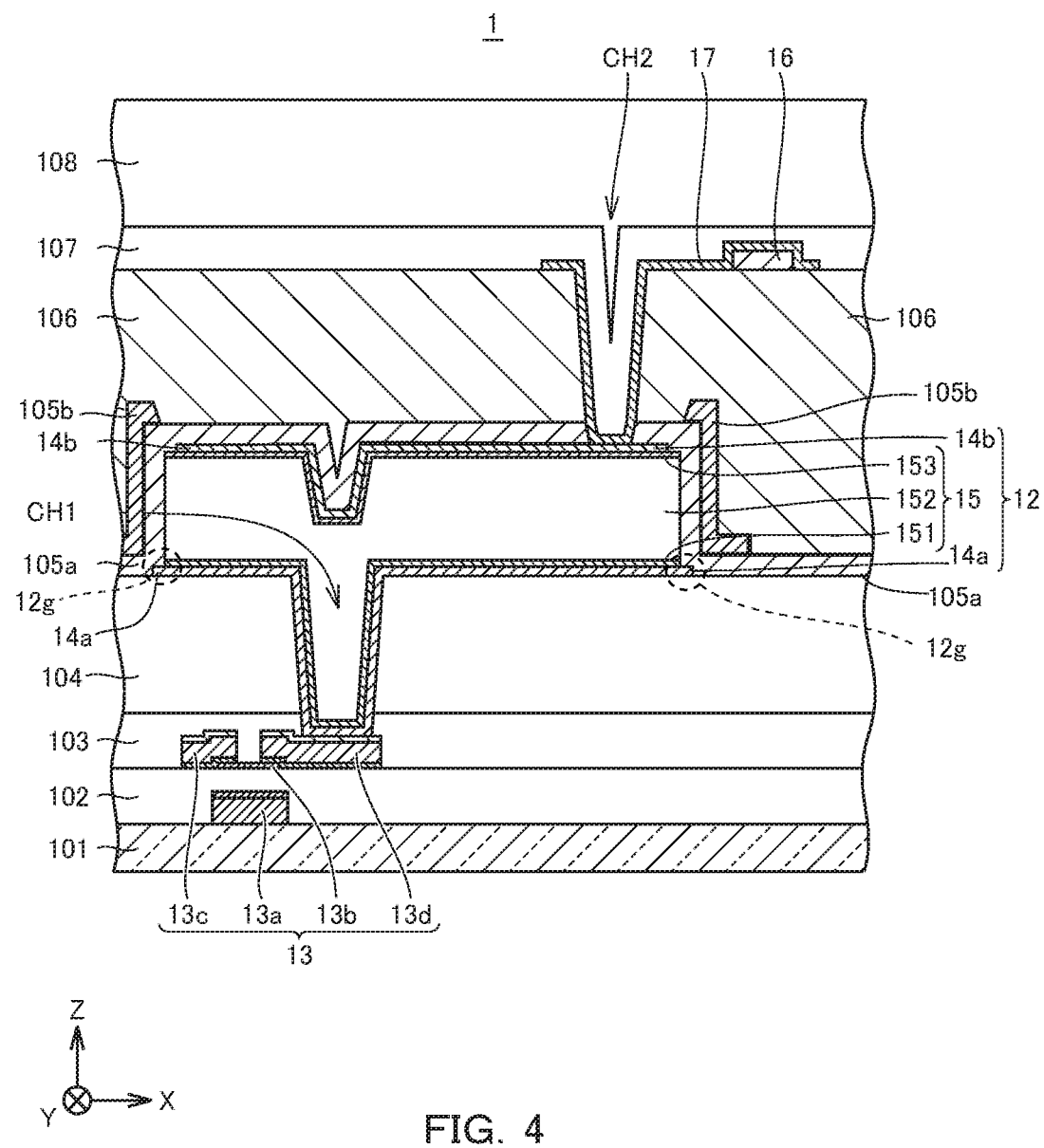
FIG. 4 is a cross-sectional view of the pixel part shown in FIG. 3 taken along line A-A.

Here, FIG. 4 shows a cross-sectional view of the pixel portion P1 shown in FIG. 3, taken along line A-A. In FIG. 4, scintillation light obtained by conversion by the scintillator 4 is incident from the Z-axis direction positive side of the active matrix substrate 1.

As shown in FIG. 4, the gate electrode 13a integrated with the gate line 11 (see FIG. 3), and a gate insulating film 102 are formed on the substrate 101. The substrate 101 is a substrate having an insulating property, and is formed with, for example, a glass substrate.

The gate electrode 13a and the gate line 11 are formed by laminating, for example, a metal film made of titanium (Ti) in the lower layer, and a metal film made of copper (Cu) in the upper layer. The gate electrode 13a and the gate line 11 may have a structure obtained by laminating a metal film made of aluminum (Al) in the lower layer, and a metal film made of molybdenum nitride (MoN) in the upper layer. In this example, the metal films in the lower layer and the upper layer have thicknesses of about 300 nm and 100 nm, respectively. The material and thickness of the gate electrode 13a and the gate line 11, however, are not limited to these.

The gate insulating film 102 covers the gate electrode 13a. To form the gate insulating film 102, the following may be used, for example: silicon oxide ($SiO_x$); silicon nitride ($SiN_x$); silicon oxide nitride ($SiO_xN_y$) (x>y); silicon nitride oxide ($SiN_xO_y$) (x>y); or the like. In the present embodiment, the gate insulating film 102 is formed by laminating an insulating film made of silicon oxide ($Si_x$) in the upper layer, and an insulating film made of silicon nitride ($SiN_x$) in the lower layer. In this example, the insulating film made of silicon oxide ($SiO_x$) has a thickness of about 50 nm, and the insulating film made of silicon nitride ($SiN_x$) has a thickness of about 400 nm. The material and the thickness of the gate insulating film 102, however, are not limited to these.

A semiconductor activity layer 13b, and a source electrode 13c and a drain electrode 13d connected with the semiconductor activity layer 13b, are provided on the gate electrode 13a with the gate insulating film 102 being interposed therebetween.

The semiconductor activity layer 13b is formed in contact with the gate insulating film 102. The semiconductor activity layer 13b is made of an oxide semiconductor. As the oxide semiconductor, for example, the following may be used: $InGaO_3(ZnO)_5$; magnesium zinc oxide ($Mg_xZn_{1-x}O$); cadmium zinc oxide ($Cd_xZn_{1-x}O$); cadmium oxide (CdO); or an amorphous oxide semiconductor containing indium (In), gallium (Ga), and zinc (Zn) at a predetermined ratio. In this example, the semiconductor activity layer 13b is formed with an amorphous oxide semiconductor containing indium (In), gallium (Ga), and zinc (Zn) at a predetermined ratio. In this example, the semiconductor activity layer 13b has a thickness of about 70 nm. The material and the thickness of the semiconductor activity layer 13b, however, are not limited to these.

The source electrode 13c and the drain electrode 13d are arranged so as to be in contact with a part of the semiconductor activity layer 13b on the gate insulating film 102. In this example, the source electrode 13c is integrally formed with the source line 10 (see FIG. 3). The drain electrode 13d is connected with the lower electrode 14a via the contact hole CH1.

The source electrode 13c and the drain electrode 13d are formed on the same layer. The source electrode 13c and drain electrode 13d have a three-layer structure obtained by laminating, for example, a metal film made of molybdenum nitride (MoN), a metal film made of aluminum (Al), and a metal film made of titanium (Ti). In this example, these three layers have thicknesses of about 100 nm, 500 nm, and 50 nm, respectively, in the order from the upper layer. The material and the thickness of the source electrode 13c and drain electrode 13d, however, are not limited to these.

On the gate insulating film 102, a first insulating film 103 is provided so as to overlap with the source electrode 13c and drain electrode 13d. The first insulating film 103 has an opening on the drain electrode 13d. In this example, the first insulating film 103 is formed with, for example, an inorganic insulating film made of silicon nitride (SiN).

On the first insulating film 103, a second insulating film 104 is provided. The second insulating film 104 has an opening on the drain electrode 13d, and the opening of the first insulating film 103 and the opening of the second insulating film 104 form the contact hole CH1.

The second insulating film 104 is made of, for example, an organic transparent resin such as an acrylic resin or a siloxane-based resin, and has a thickness of about 2.5 μm. The material and the thickness of the second insulating film 104, however, are not limited to these.

On the second insulating film 104, the lower electrode 14a is provided. The lower electrode 14a is connected with the drain electrode 13d via the contact hole CH1. The lower electrode 14a is formed with, for example, a metal film containing molybdenum nitride (MoN), and has a thickness of about 200 nm. The material and the thickness of the lower electrode 14b, however, are not limited to these.

On the lower electrode 14a, the photoelectric conversion layer 15 is provided. The photoelectric conversion layer 15 has such a configuration that an n-type amorphous semiconductor layer 151, an intrinsic amorphous semiconductor layer 152, and a p-type amorphous semiconductor layer 153 are laminated in the stated order.

In the present embodiment, the photoelectric conversion layer 15 has a length in the X axis direction which is smaller than the length of the lower electrode 14a in the X axis direction. In other words, the lower electrode 14a protrudes toward an outer side of the photoelectric conversion layer 15 with respect to the side surface of the photoelectric conversion layer 15, and the side surface of the photodiode 12 has a protrusion portion 12g, as shown in the broken-line frame in FIG. 4.

The n-type amorphous semiconductor layer 151 is made of amorphous silicon doped with an n-type impurity (for example, phosphorus).

The intrinsic amorphous semiconductor layer 152 is made of intrinsic amorphous silicon. The intrinsic amorphous semiconductor layer 152 is formed in contact with the n-type amorphous semiconductor layer 151.

The p-type amorphous semiconductor layer 153 is made of amorphous silicon doped with a p-type impurity (for example, boron). The p-type amorphous semiconductor layer 153 is formed in contact with the intrinsic amorphous semiconductor layer 152.

In this example, the n-type amorphous semiconductor layer 151 has a thickness of about 30 nm, the intrinsic amorphous semiconductor layer has a thickness of about 1000 nm, and the p-type amorphous semiconductor layer 153 has a thickness of about 5 nm. The materials used in these semiconductor layers and the thicknesses thereof, however, are not limited to these.

On the photoelectric conversion layer 15, the upper electrode 14b is provided. The upper electrode 14b is made of, for example, indium tin oxide (ITO), and has a thickness of about 70 nm. The material and the thickness of the upper electrode 14b, however, are not limited to these.

A third insulating film 105a is provided on the surface of the photodiode 12. More specifically, the third insulating film 105a has an opening on the upper electrode 14b, and covers the side surface of the photodiode 12 and the second insulating film 104. In this example, the third insulating film 105a is formed with, for example, an inorganic insulating film made of silicon nitride (SiN), and has a thickness of about 300 nm. The material and the thickness of the third insulating film 105a, however, are not limited to these.

A protection film 105b is provided so as to overlap with a part of the third insulating film 105a. More specifically, the protection film 105b does not overlap with the upper electrode 14b in the photodiode 12 when viewed in a plan view, but is provided on a part of the third insulating film 105a so as to cover the third insulating film 105a in contact with the side surface of the photodiode 12. Outside the photodiode 12, the protection film 105b is provided not continuously up to an adjacent pixel, and is separated from another protection film 105b for the adjacent pixel. On the protrusion portion 12g on the side surface of the photodiode 12, the third insulating film 105a and the protection film 105b are laminated. The scintillation light enters on the surface of the photodiode 12 that is located the upper electrode 14b side. Since the protection film 105b does not overlap with the upper electrode 14b when viewed in a plan view as described above, it is unlikely that the transmittance in the pixels would decrease.

For forming the protection film 105b, a material having conductivity or an insulating property may be used, as long as the material has corrosion resistance against moisture. More specifically, for forming the protection film 105b, the following material can be used, for example: a metal having corrosion resistance against moisture, such as titanium oxide (TiO), titanium nitride (TiN), titanium (Ti), molybdenum niobium oxide (MoNbO), molybdenum niobium nitride (MoNbN), molybdenum niobium (MoNb), tungsten (W), or tantalum (Ta); a metal nitride film; or metal oxide. Further, as a material for forming the protection film 105b, the following can be used: a transparent conductive film or a transparent amorphous semiconductor film having corrosion resistance against moisture, made of, for example, IZO (In—Zn—O) or IGZO (In—Ga—Zn—O). Further, an alloy containing the above-described materials may be used. Incidentally, the corrosion resistance mentioned above means that a metal is corroded (oxidized) by moisture and is dissolved, which makes it unlikely that moisture would permeate into the metal.

A fourth insulating film 106 is provided so as to be separated on the opening of the third insulating film 105a and cover the third insulating film 105a and the protection film 105b, and further, the contact hole CH2 is formed so as to pass through the fourth insulating film 106 and the third insulating film 105a. The fourth insulating film 106 is made of an organic transparent resin, for example, an acrylic resin or a siloxane-based resin, and has a thickness of, for example, about 2.5 µm. The material and the thickness of the fourth insulating film 106, however, are not limited to those.

On the fourth insulating film 106, the bias line 16, as well as the transparent conductive film 17 connected with the bias line 16, are provided. The transparent conductive film 17 is in contact with the upper electrode 14b at the contact hole CH2.

The bias line 16 is connected to the control unit 2 (see FIG. 1). The bias line 16 applies a bias voltage input from the control unit 2, to the upper electrode 14b via the contact hole CH2.

The bias line 16 has a three-layer structure. More specifically, the bias line 16 has a structure obtained by laminating, in the order from the upper layer, a metal film made of molybdenum nitride (MoN), a metal film made of aluminum (Al), and a metal film made of titanium (Ti). In this example, the metal films of these three layers have thicknesses of, in the order from the upper layer, about 100 nm, 300 nm, and 50 nm, respectively. The materials and the thicknesses of the bias line 16, however, are not limited to these.

The transparent conductive film 17 is made of, for example, ITO, and has a thickness of about 70 nm; the material and the thickness of the transparent conductive film 17, however, are not limited to these.

Further, on the 4 insulating film 106, a fifth insulating film 107 is provided so as to cover the transparent conductive film 17. The fifth insulating film 107 is made of, for example, silicon nitride (SiN), and has a thickness of, for example, about 200 nm; the material and the thickness of the fifth insulating film 107, however, are not limited to these.

A sixth insulating film 108 formed with a resin film is provided so as to cover the fifth insulating film 107. The sixth insulating film 108 is formed with an organic transparent resin made of, for example, an acrylic resin or a siloxane-based resin, and has a thickness of, for example, about 2.0 μm; the material and the thickness of the sixth insulating film 108, however, are not limited to these.

Method for Producing the Active Matrix Substrate 1

Figure 5A:
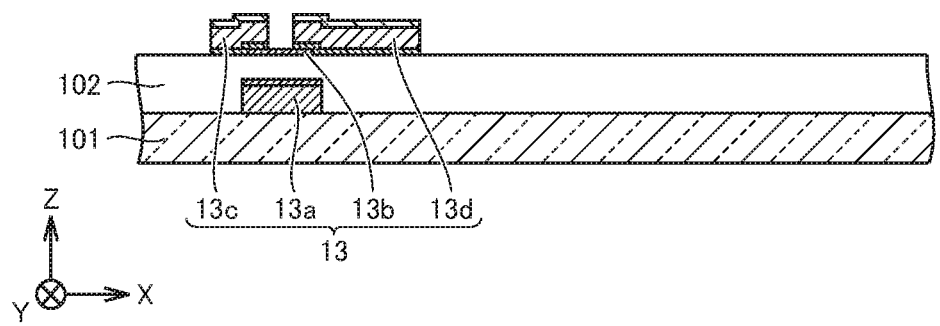
FIG. 5A is a view for explaining a step for producing the pixel part shown in FIG. 4, which is a cross-sectional view showing a state in which a TFT is formed in the pixel part.
Figure 5B:
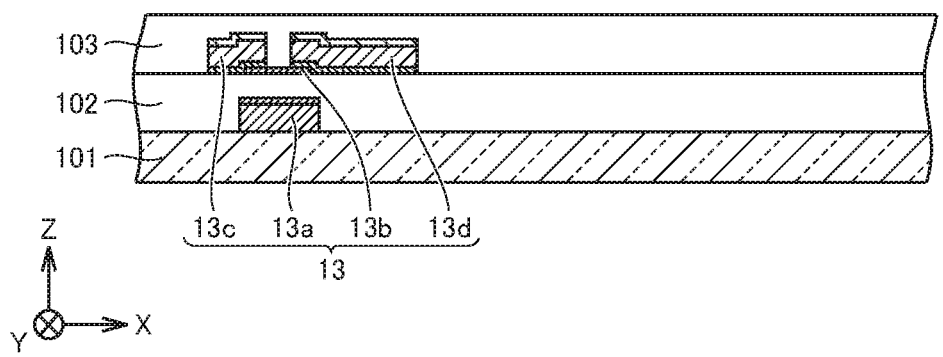
FIG. 5B is a cross-sectional view showing a step of forming a first insulating film shown in FIG. 4.
Figure 5C:
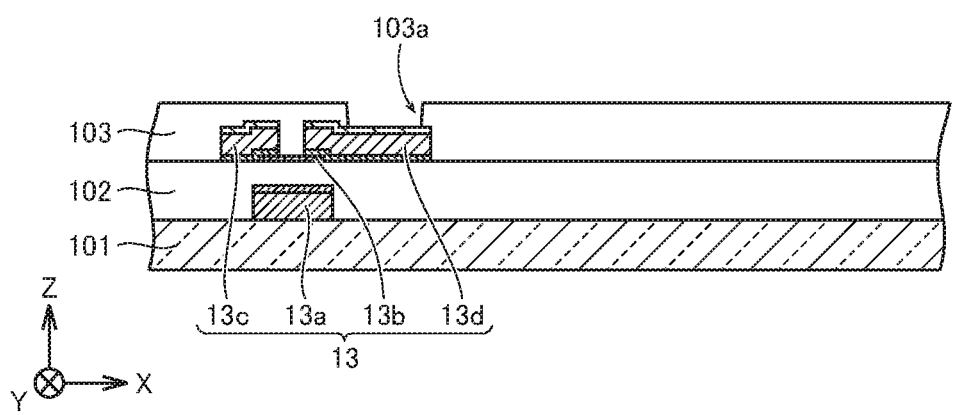
FIG. 5C is a cross-sectional view showing a step of forming an opening in the first insulating film shown in FIG. 5B.
Figure 5D:
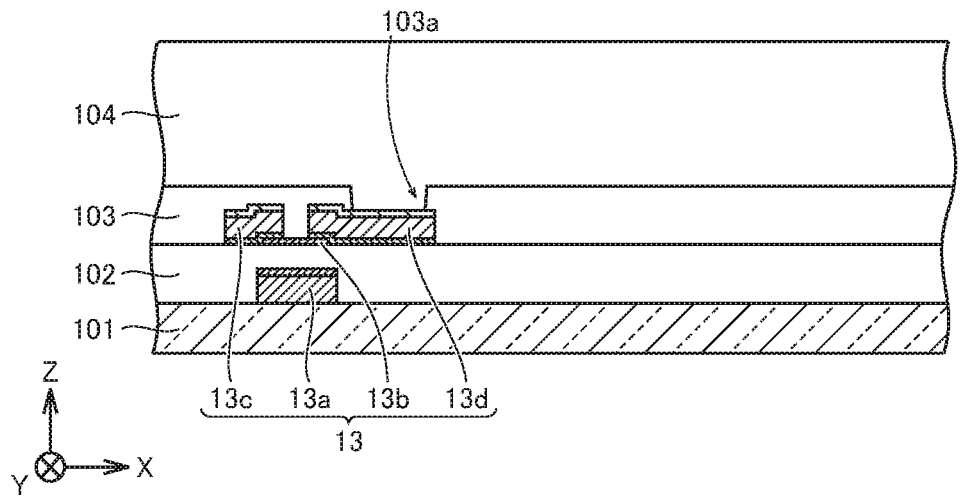
FIG. 5D is a cross-sectional view showing a step of forming a second insulating film shown in FIG. 4.
Figure 5E:
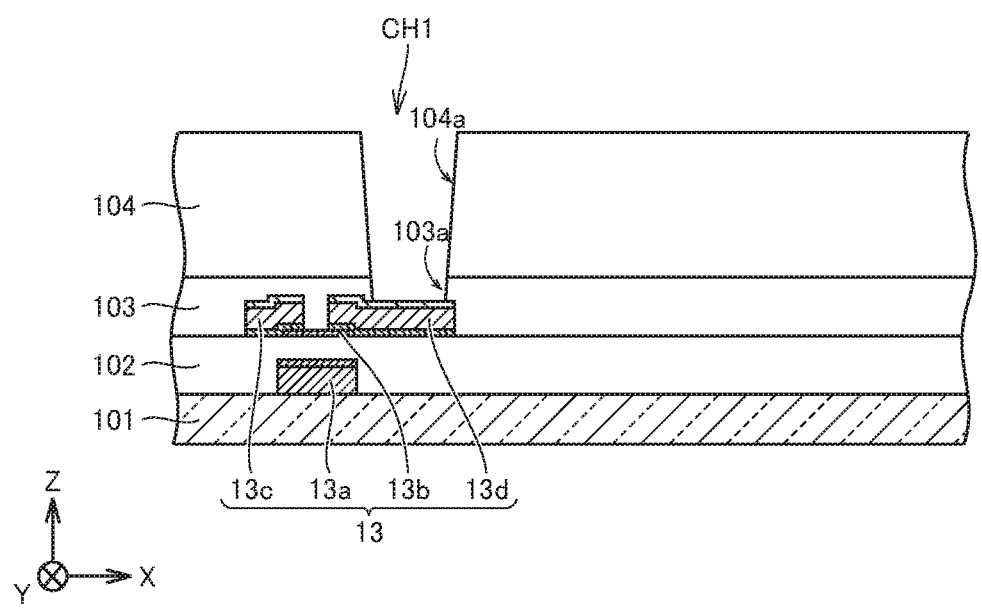
FIG. 5E is a cross-sectional view showing a step of forming an opening of the second insulating film shown in FIG. 5D, so as to form a contact hole CH1 shown in FIG. 4.
Figure 5F:
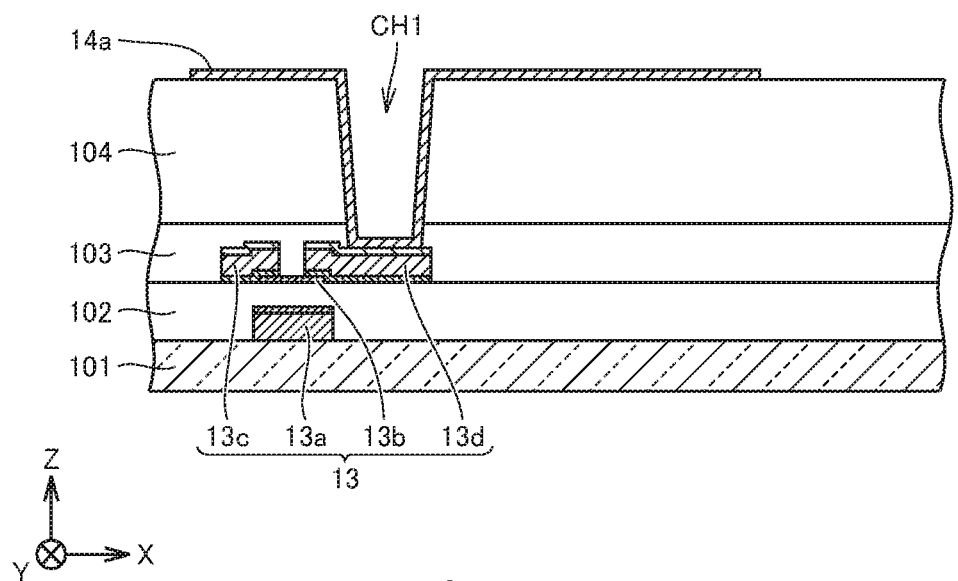
FIG. 5F is a cross-sectional view showing a step of forming a lower electrode shown in FIG. 4.
Figure 5G:
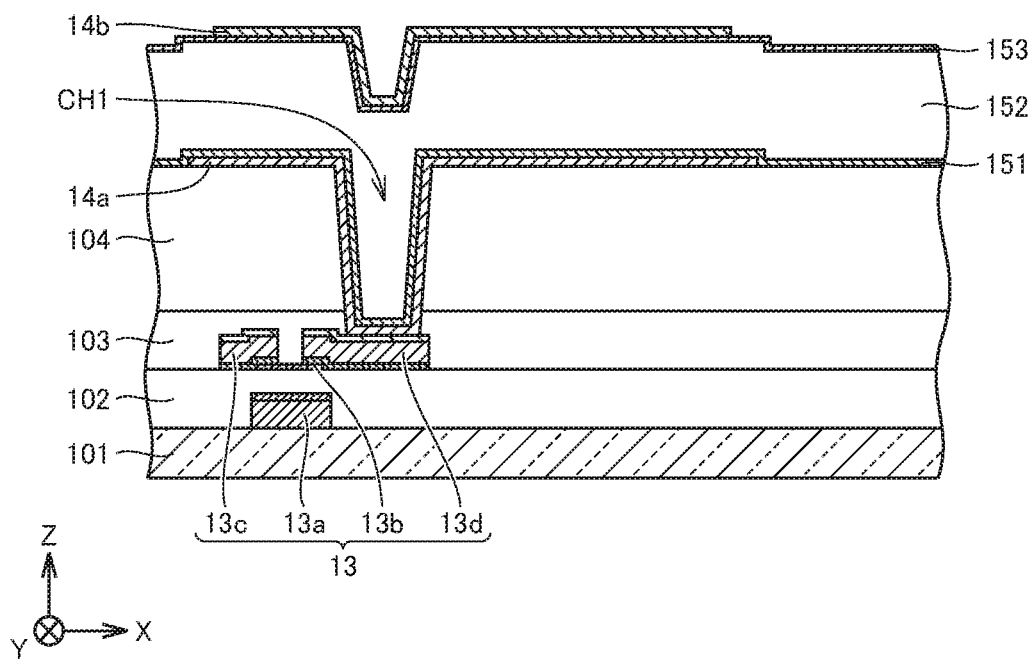
FIG. 5G is a cross-sectional view showing a step of forming a semiconductor layer as a photoelectric conversion layer and an upper electrode shown in FIG. 4.
Figure 5H:
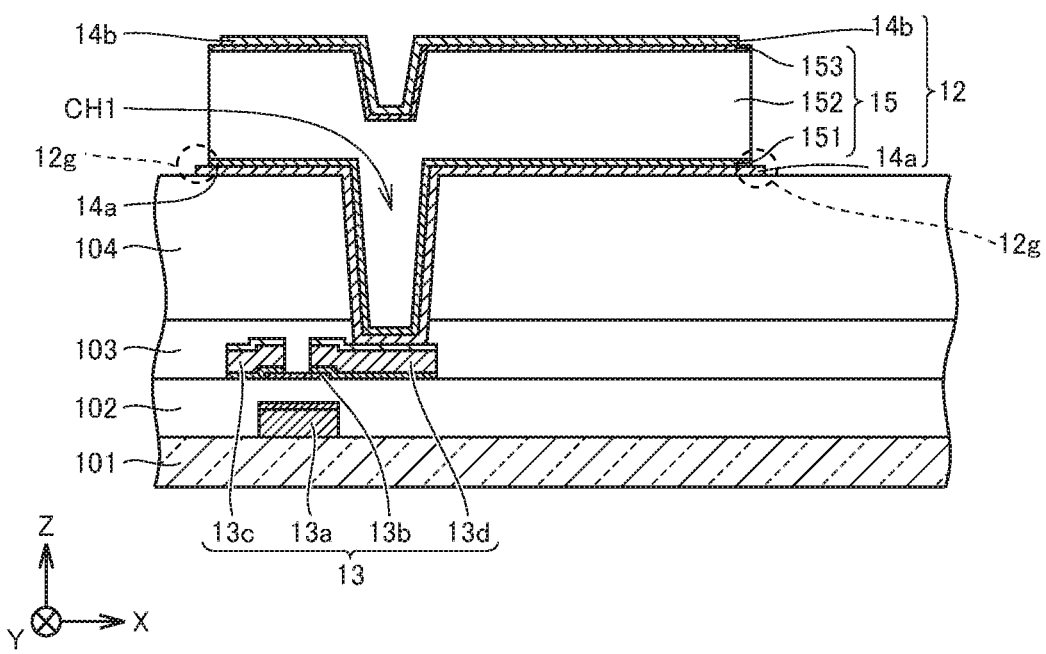
FIG. 5H is a cross-sectional view showing a step of patterning the semiconductor layer shown in FIG. 5G so as to form the photoelectric conversion layer.
Figure 5I:
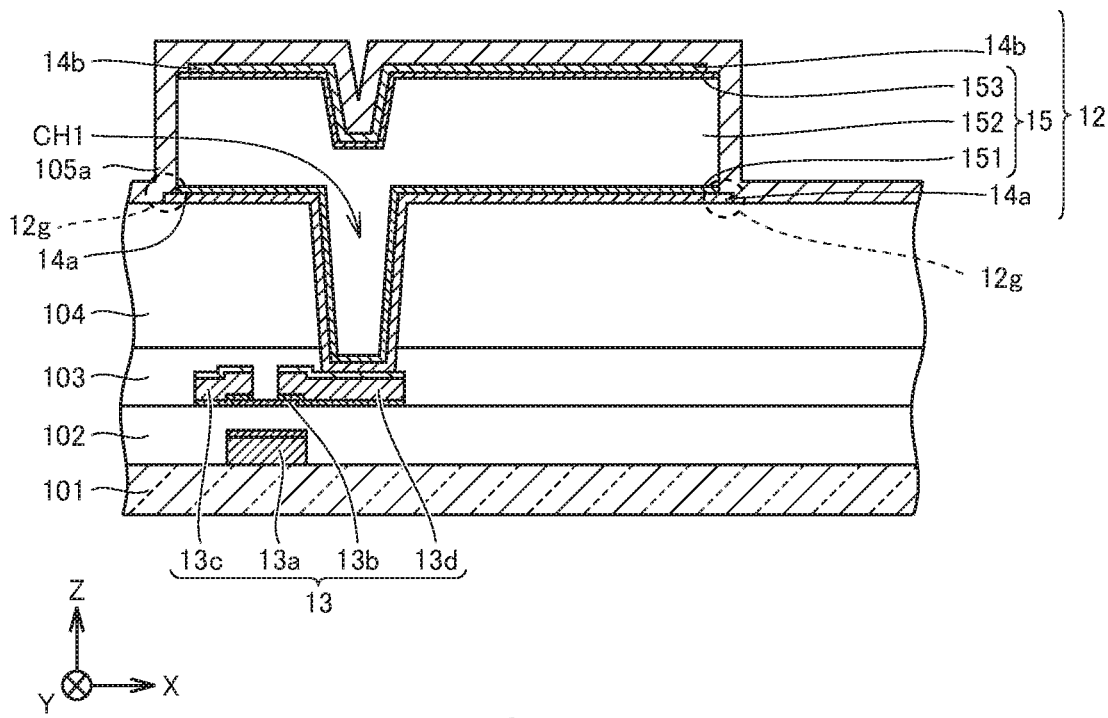
FIG. 5I is a cross-sectional view showing a step of forming a third insulating film shown in FIG. 4.
Figure 5J:
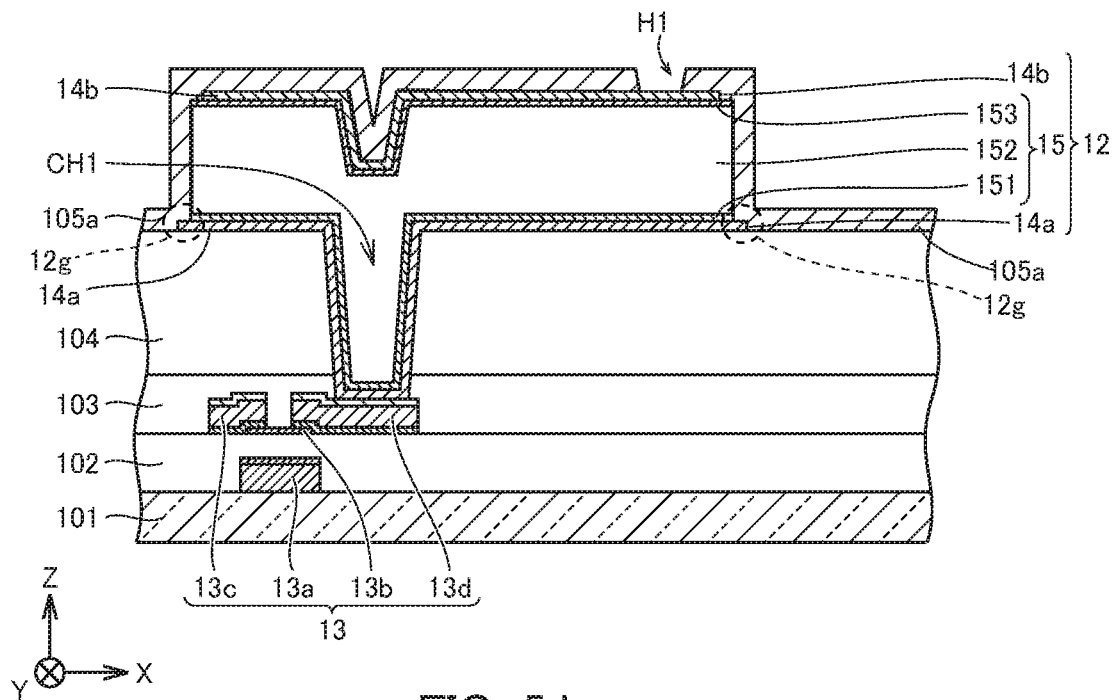
FIG. 5J is a cross-sectional view showing a step of forming an opening in the third insulating film shown in FIG. 5I.
Figure 5K:
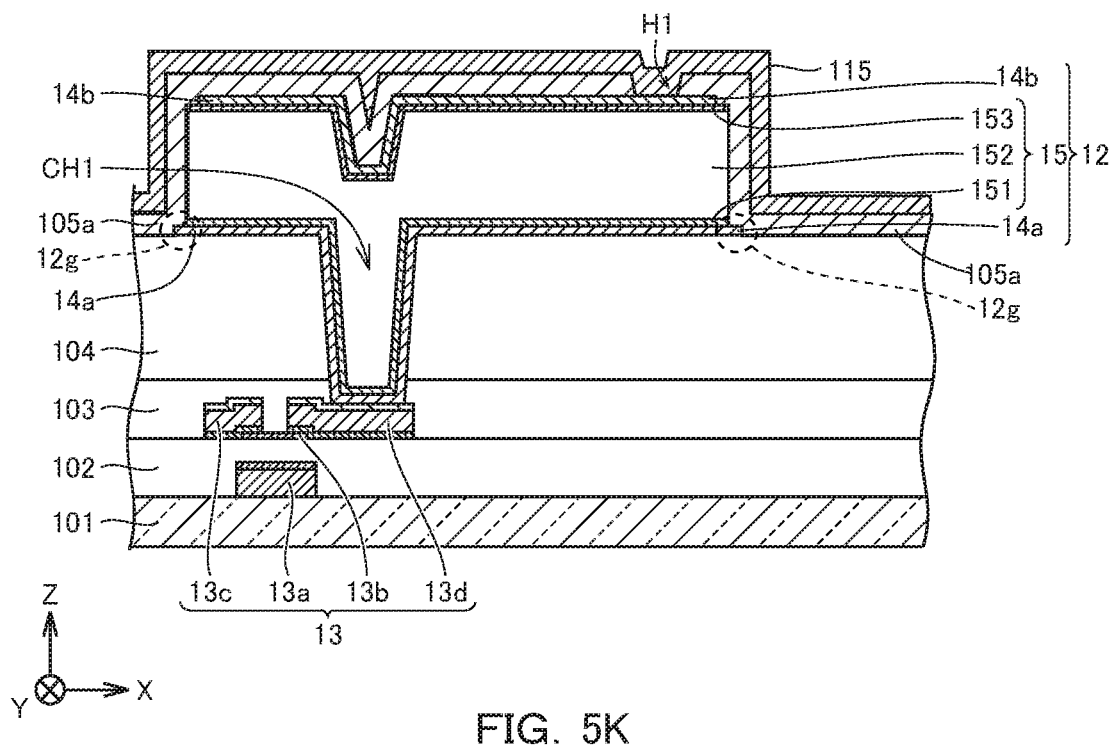
FIG. 5K is a cross-sectional view showing a step of forming a thin film as a protection film shown in FIG. 4.
Figure 5L:
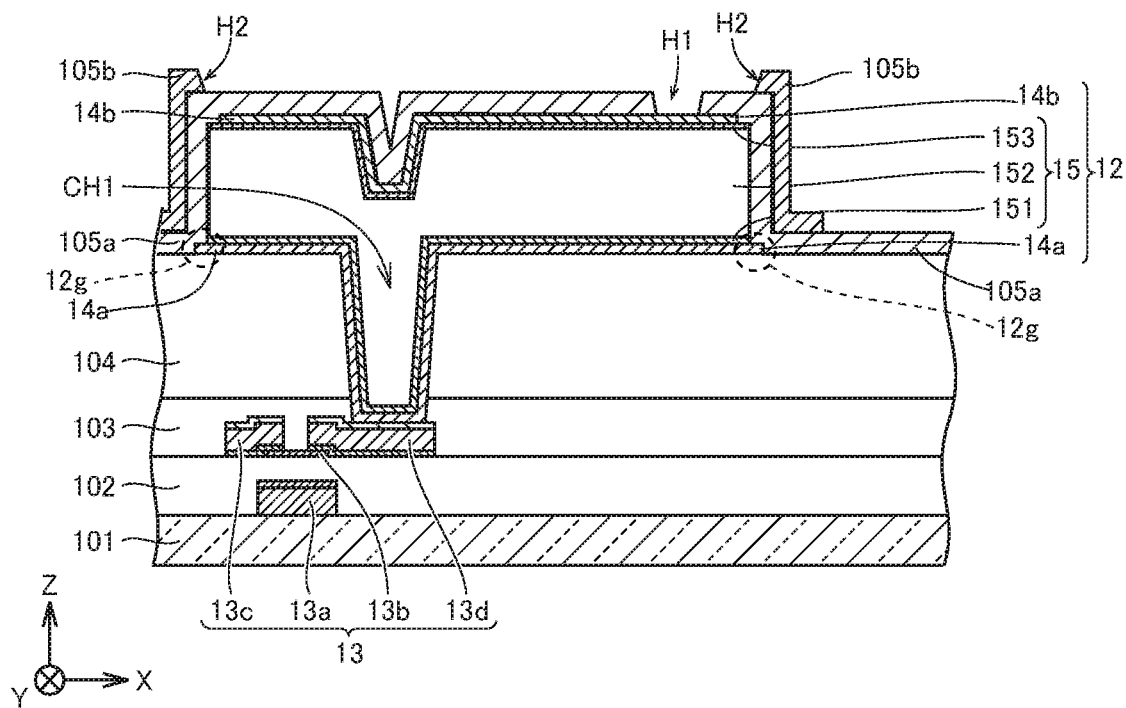
FIG. 5L is a cross-sectional view showing a step of patterning the thin film shown in FIG. 5K so as to form a protection film.
Figure 5M:
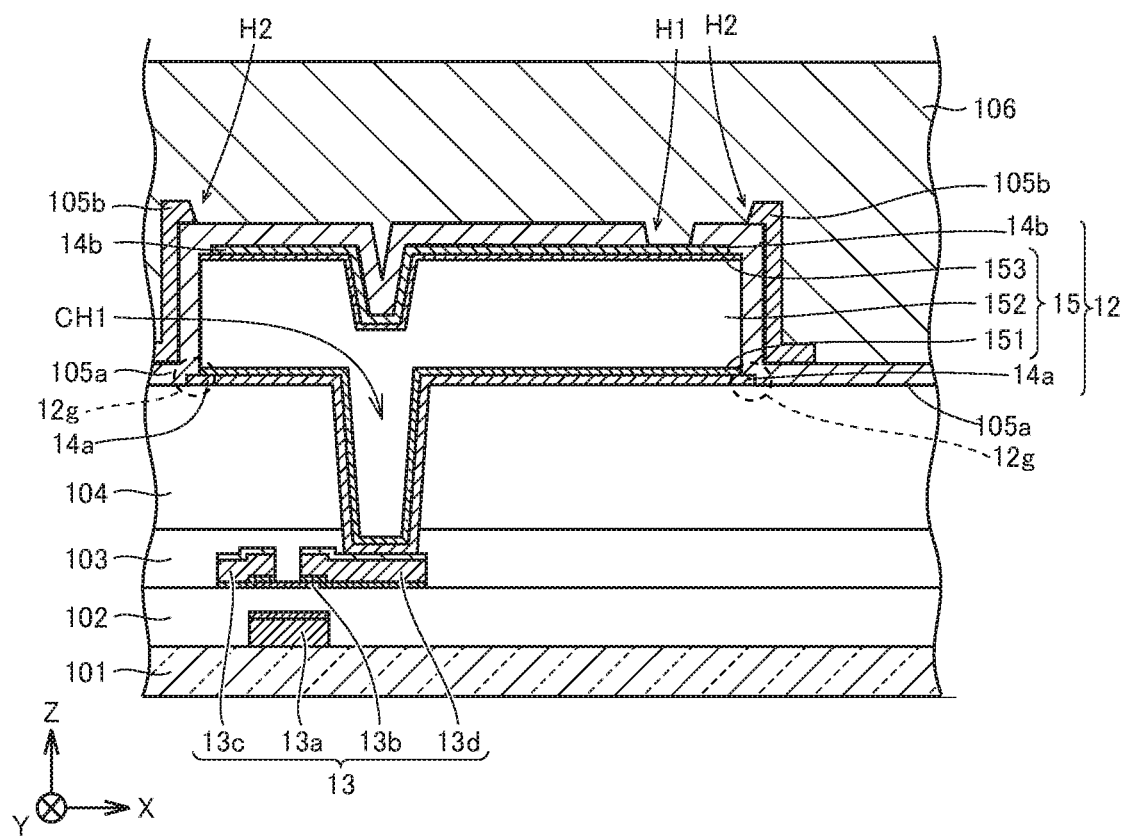
FIG. 5M is a cross-sectional view showing a step of forming a fourth insulating film shown in FIG. 4.
Figure 5N:
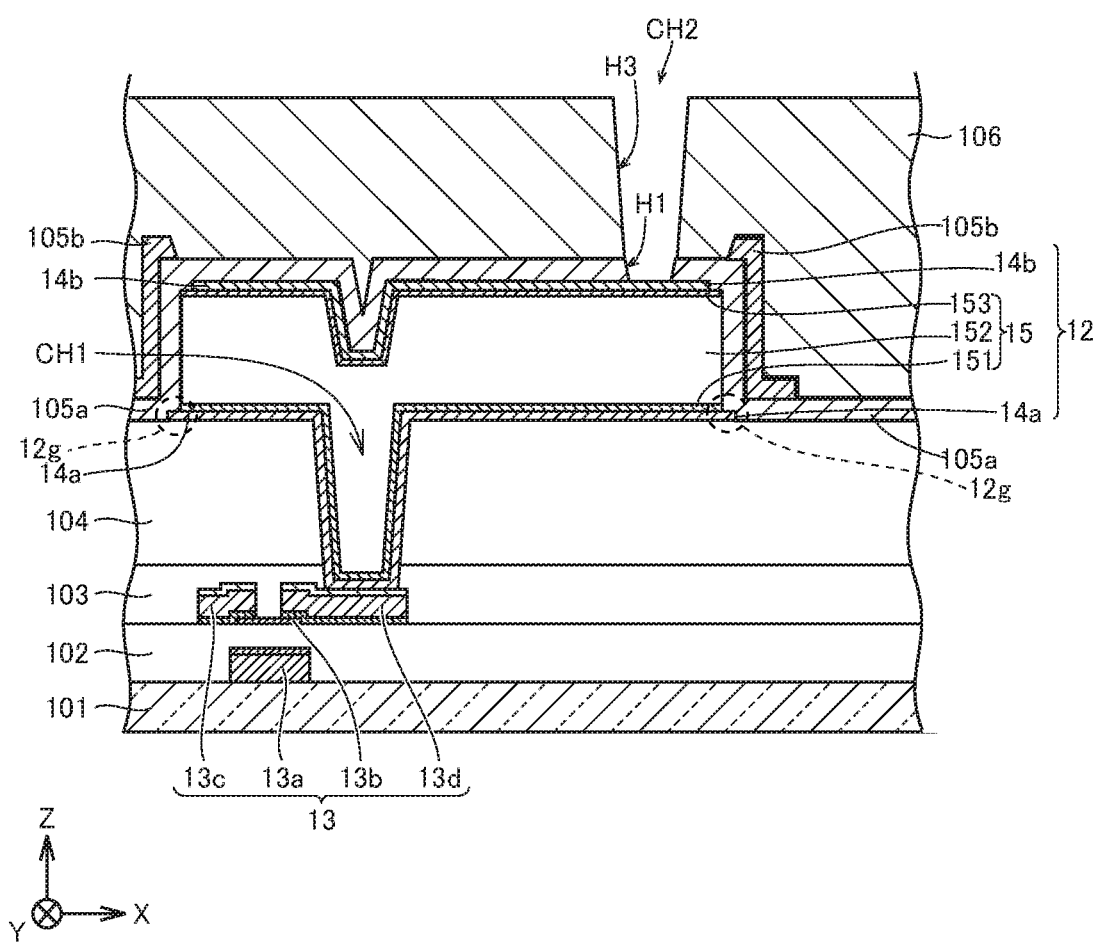
FIG. 5N is a cross-sectional view showing a step of forming an opening in the fourth insulating film shown in FIG. 5M.
Figure 50:
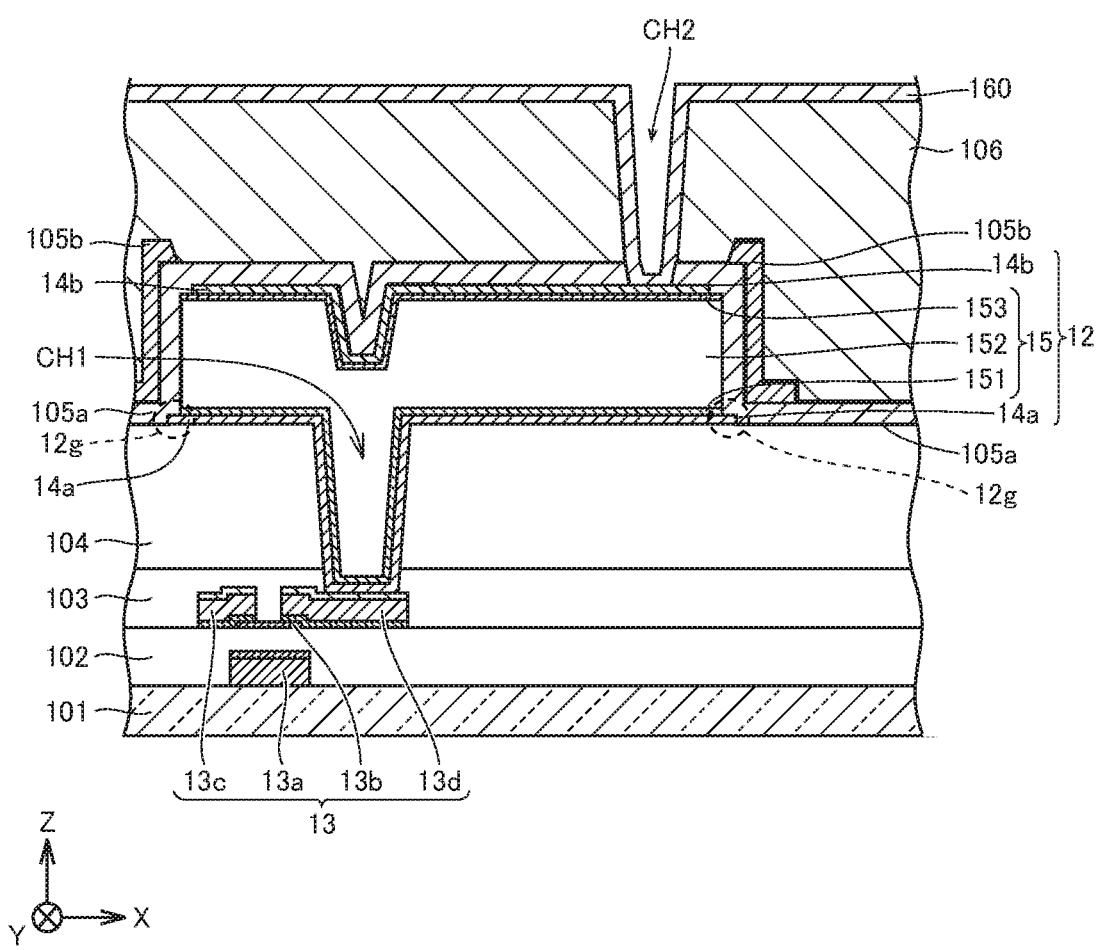
Figure 5P:
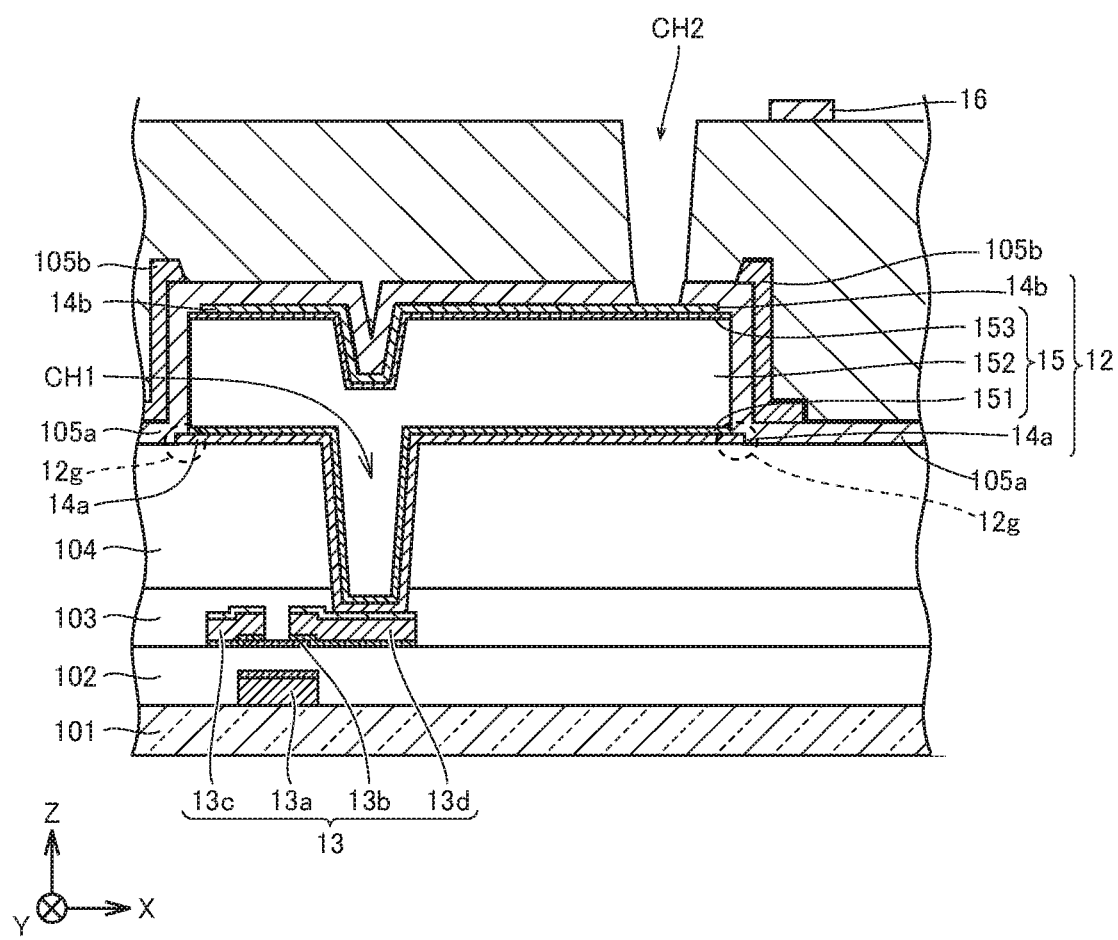
FIG. 5P is a cross-sectional view showing a step of patterning the metal film shown in FIG. 5O so as to form the bias line.
Figure 5Q:
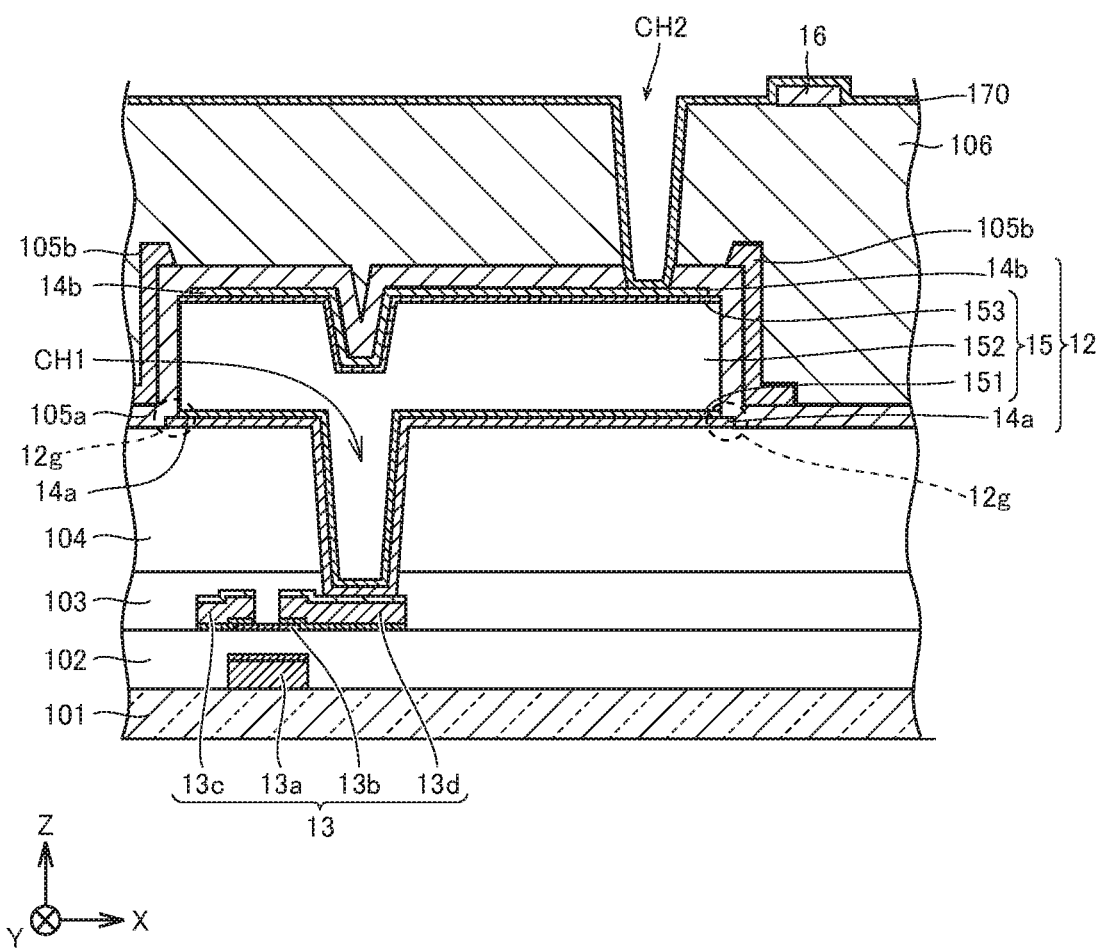
FIG. 5Q is a cross-sectional view showing a step of forming a transparent conductive film shown in FIG. 4.
Figure 5R:
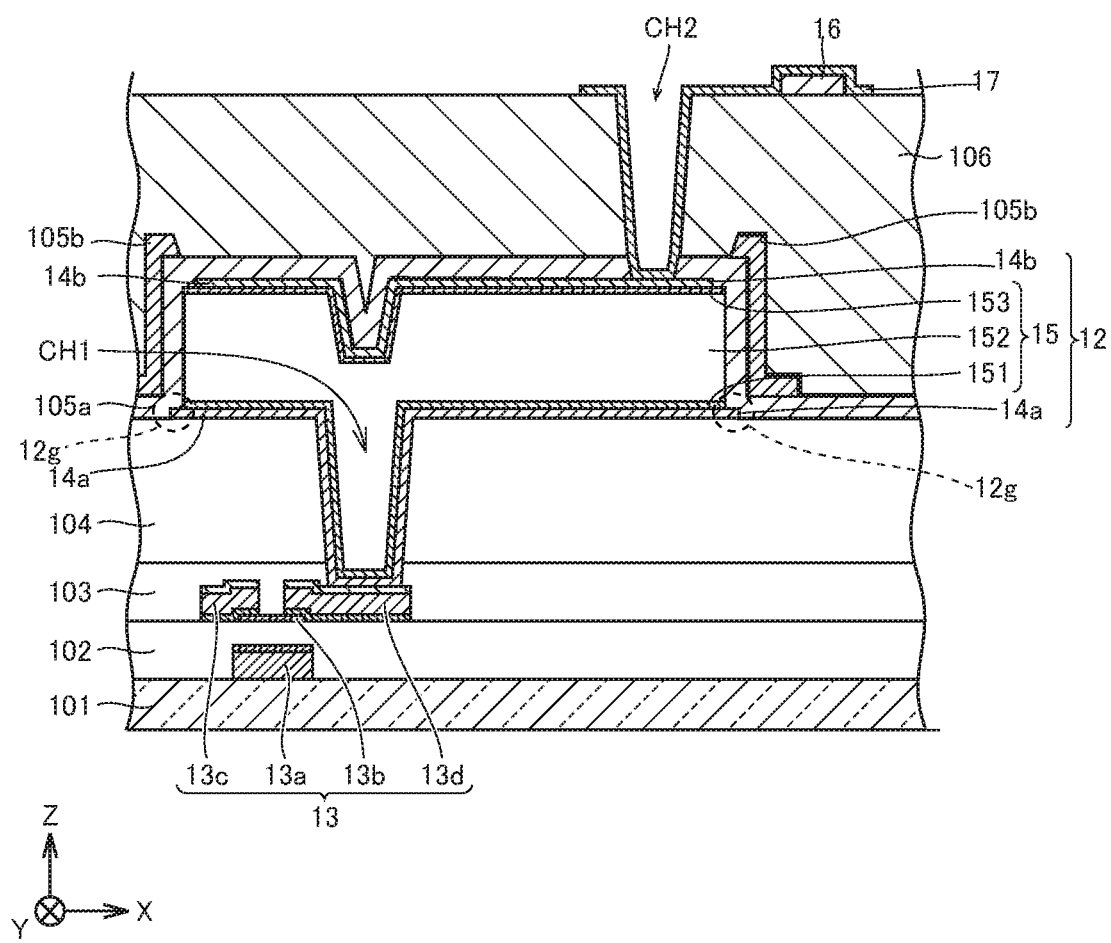
FIG. 5R is a cross-sectional view showing a step of patterning the transparent conductive film shown in FIG. 5Q.
Figure 5S:
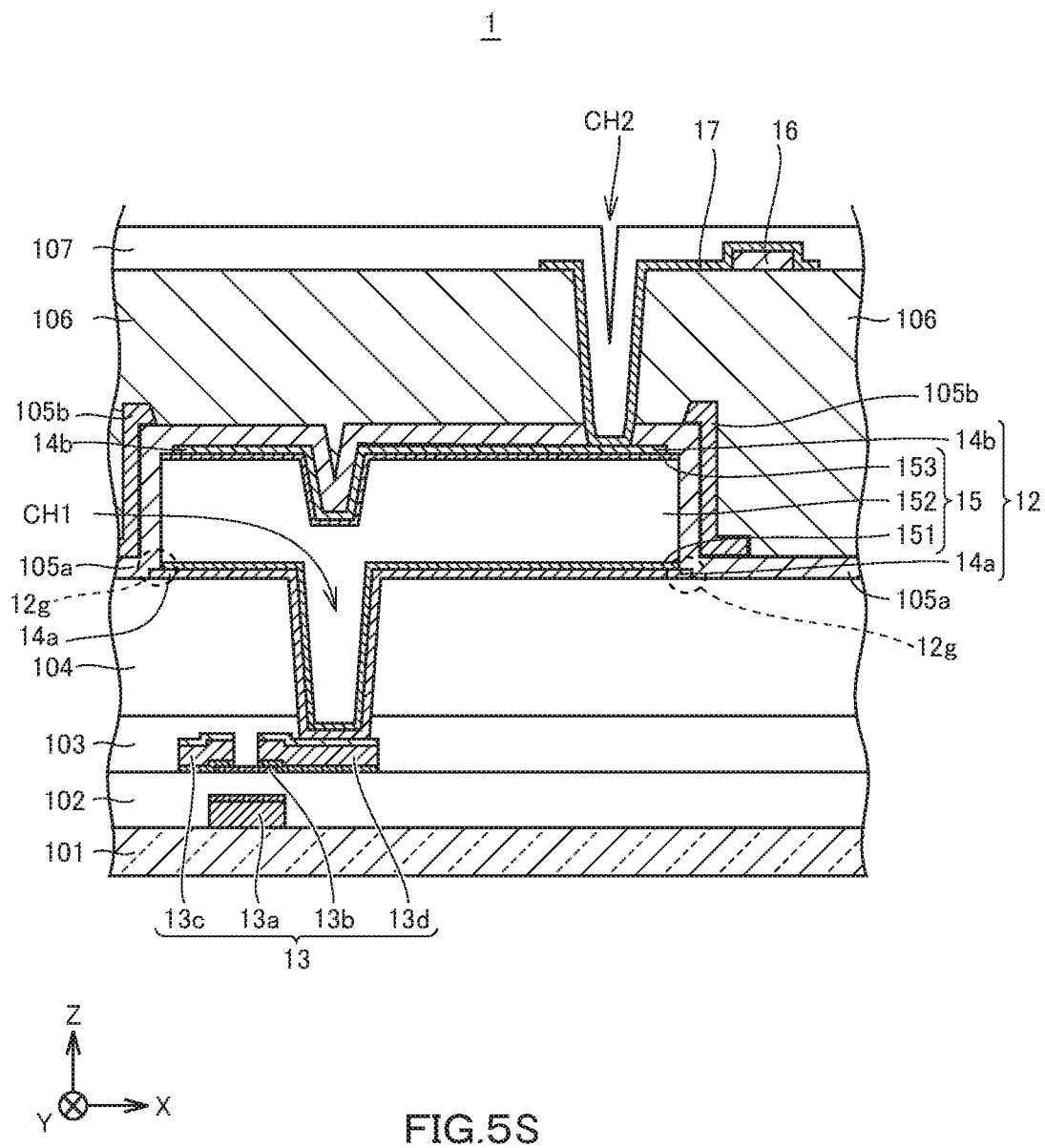
FIG. 5S is a cross-sectional view showing a step of forming a fifth insulating film shown in FIG. 4.
Figure 5T:
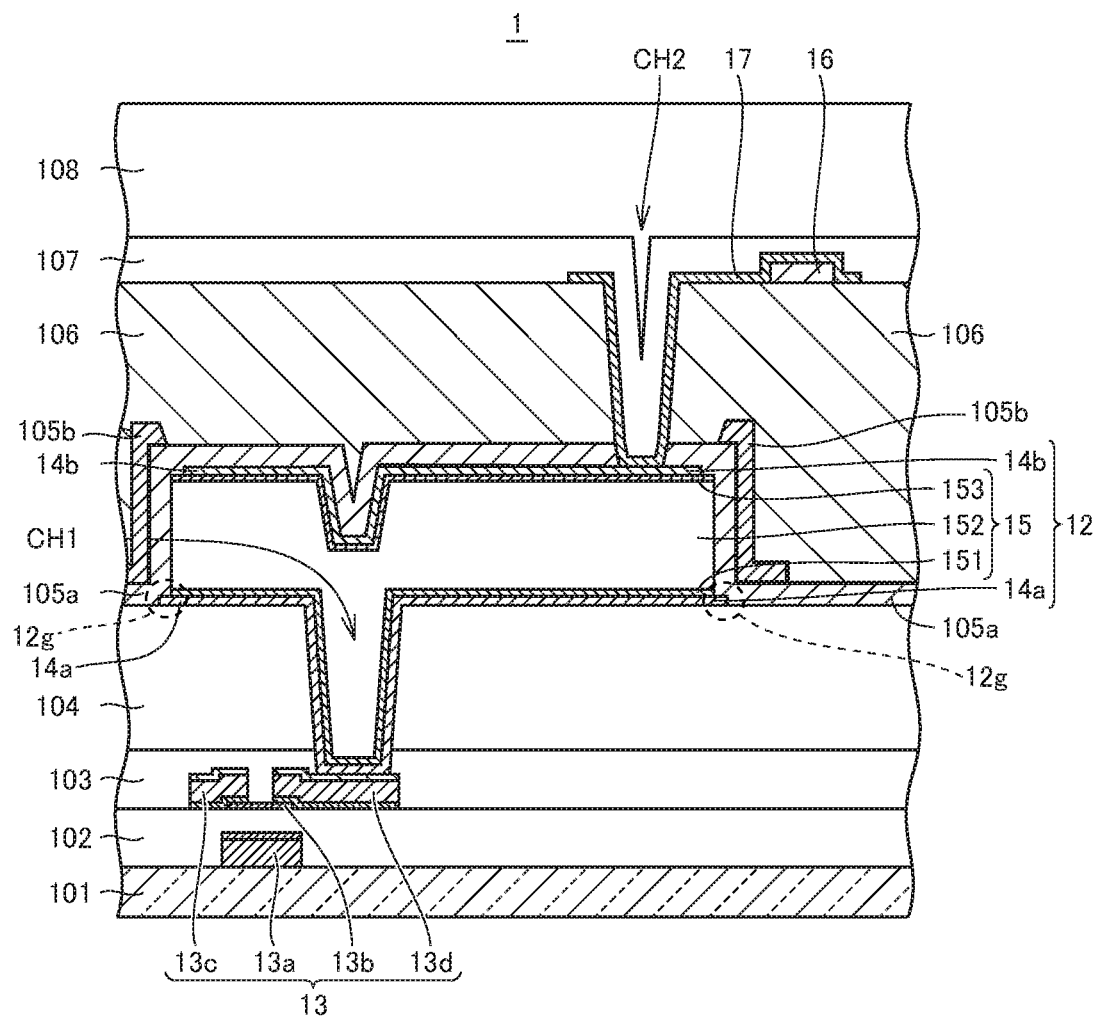
FIG. 5T is a cross-sectional view showing a step of forming a sixth insulating film shown in FIG. 4.

Next, the following description describes a method for producing the active matrix substrate 1 while referring to FIGS. 5A to 5T. FIGS. 5A to 5T show cross-sectional views of the active matrix substrate 1 in steps of the producing process, respectively (cross sections taken along line A-A in FIG. 3).

As shown in FIG. 5A, the gate insulating film 102 and the TFT 13 are formed on the substrate 101 by using a known method.

Subsequently, the first insulating film 103 is formed with silicon nitride (SiN), by using, for example, plasma CVD (see FIG. 5B).

Thereafter, a heat treatment at about 350° C. is applied to an entire surface of the substrate 101, and then, photolithography, and dry etching using fluorine-containing gas are performed, whereby the first insulating film 103 is patterned (see FIG. 5C). Through these steps, the opening 103a of the first insulating film 103 is formed above the drain electrode 13d.

Next, the second insulating film 104 made of an acrylic resin or a siloxane-based resin is formed on the first insulating film 103 by, for example, slit-coating (see FIG. 5D). Thereafter, by using photolithography, the second insulating film 104 is patterned (see FIG. 5E). Through this step, the opening 104a of the second insulating film 104 that overlaps with the opening 103a when viewed in a plan view is formed, whereby the contact hole CH1 composed of the opening 103a and the 104a is formed.

Subsequently, a metal film made of molybdenum nitride (MoN) is formed by, for example, sputtering, and photolithography and wet etching are carried out so that the metal film is patterned. Through these steps, the lower electrode 14a is formed on the second insulating film 104 so that the lower electrode 14a is connected with the drain electrode 13d via the contact hole CH1 (see FIG. 5F).

Next, the n-type amorphous semiconductor layer 151, the intrinsic amorphous semiconductor layer 152, and the p-type amorphous semiconductor layer 153 are formed in the stated order by using, for example, plasma CVD. Thereafter, for example, a transparent conductive film made of ITO is formed by using sputtering, and photolithography and dry etching are carried out so that the transparent conductive film is patterned. Through this step, the upper electrode 14b is formed on the p-type amorphous semiconductor layer 153 (see FIG. 5G).

Next, photolithography and dry etching are carried out so as to pattern the n-type amorphous semiconductor layer 151, the intrinsic amorphous semiconductor layer 152, and the p-type amorphous semiconductor layer 153 (see FIG. 5H). Through these steps, the photoelectric conversion layer 15 is formed on an inner side of the area of the lower electrode 14a when viewed in a plan view, which results in that the lower electrode 14a protrudes with respect to the side surface of the photoelectric conversion layer 15, whereby a protrusion portion 12g is formed.

Subsequently, the third insulating film 105a made of silicon nitride (SiN) is formed by, for example, plasma CVD (see FIG. 5I). Thereafter, photolithography and dry etching are carried out so that the third insulating film 105a is patterned (see FIG. 5J). Through these steps, an opening H1 of the third insulating film 105a is formed on the upper electrode 14b.

Subsequently, a thin film 115 made of titanium oxide (TiO) is formed on the third insulating film 105a by, for example, sputtering (see FIG. 5K). Thereafter, photolithography and wet etching are carried out so as to pattern the thin film 115 (see FIG. 5L). Through these steps, the protection film 105b is formed. The protection film 105b has an opening H2 on the third insulating film 105a above the photodiode 12 so that the protection film 105b should not overlap with the upper electrode 14b when viewed in a plan view, whereby the protection film 105b covers the third insulating film 105a, which is in contact with the side surface of the photodiode 12. In other words, the protection film 105b is provided so as to overlap with a part of the third insulating film 105a covering the side surface of the photodiode 12, and with a part of the third insulating film 105a provided outside the photodiode 12.

Next, the fourth insulating film 106 made of, for example, an acrylic resin or a siloxane-based resin is formed by slit-coating (see FIG. 5M). Thereafter, by using photolithography, the fourth insulating film 106 is patterned (see FIG. 5N). Through these steps, an opening H3 of the fourth insulating film 106 is formed on the opening H1 of the third insulating film 105a, whereby the contact hole CH2 composed of the openings H1 and H3 is formed.

Subsequently, a metal film 160 is formed by laminating molybdenum nitride (MoN), aluminum (Al), and titanium (Ti) in the stated order, by, for example, sputtering so as to cover the fourth insulating film 106 (see FIG. 5O). Thereafter, photolithography and wet etching are carried out so that the metal film 160 is patterned (see FIG. 5P). Through these steps, the bias line 16 is formed on the fourth insulating film 106.

Next, a transparent conductive film 170 made of ITO is formed by, for example, sputtering (see FIG. 5Q). Then, photolithography and dry etching are carried out so that the transparent conductive film 170 is patterned (see FIG. 5R). Through these steps, the transparent conductive film 17 is formed that is connected with the bias line 16 and is connected with the photoelectric conversion layer 15 via the contact hole CH2.

Subsequently, the fifth insulating film 107 made of silicon nitride (SiN) is formed on the fourth insulating film 106 so as to cover the transparent conductive film 170, by, for example, plasma CVD (see FIG. 5S).

Next, the sixth insulating film 108 made of an acrylic resin or a siloxane-based resin is formed by, for example, slit-coating so as to cover the fifth insulating film 107 (see FIG. 5T). Through this process, the active matrix substrate 1 of the present embodiment is produced.

In the active matrix substrate 1 of the present embodiment, the side surface of the photodiode 12 has the protrusion portion 12g, which is a part of the lower electrode 14a that protrudes to an outer side of the photoelectric conversion layer 15 with respect to the side surface of the photoelectric conversion layer 15. On the side surface of the photodiode 12, the third insulating film 105a and the protection film 105b are laminated. The third insulating film 105a and the protection film 105b are covered with the fourth insulating film 106, which is an organic resin film. Supposing a case where the third insulating film 105a covering the protrusion portion 12g on the side surface of the photodiode 12 is not continuously provided, even if moisture permeates the fourth insulating film 106 through a scar that occurs on a surface of the active matrix substrate 1 after the active matrix substrate 1 is produced, the protection film 105b makes it unlikely that moisture would permeate through a part where the third insulating film 105a is discontinuous. As a result, the third insulating film 105a does not serve as a leakage path for leakage current of the photodiode 12, which makes it possible to prevent decreases in the X-ray detection accuracy.

In the above-described step in FIG. 5J, the third insulating film 105a is patterned by using photolithography so that the opening H1 of the third insulating film 105a is formed, but this step may be carried out as follows. For example, after the protection film 105b is formed, the fourth insulating film 106 is formed, and the third insulating film 105a is patterned by using the fourth insulating film 106 as a mask so that the opening H1 of the third insulating film 105a is formed.

Operation of X-ray Imaging Device 100

Here, operations of the X-ray imaging device 100 shown in FIG. 1 are described. First, X-rays are emitted from the X-ray source 3. Here, the control unit 2 applies a predetermined voltage (bias voltage) to the bias line 16 (see FIG. 3 and the like). X-rays emitted from the X-ray source 3 transmit an object S, and are incident on the scintillator 4. The X-rays incident on the scintillator 4 are converted into fluorescence (scintillation light), and the scintillation light is incident on the active matrix substrate 1. When the scintillation light is incident on the photodiode 12 provided in each pixel in the active matrix substrate 1, the scintillation light is changed to charges by the photodiode 12 in accordance with the amount of the scintillation light. A signal according to the charges obtained by conversion by the photodiode 12 is read out through the source line 10 to the signal reading unit 2B (see FIG. 2 and the like) when the TFT 13 (see FIG. 3 and the like) is in the ON state according to a gate voltage (positive voltage) that is output from the gate control unit 2A through the gate line 11. Then, an X-ray image in accordance with the signal thus read out is generated in the control unit 2.

Embodiment 2

In Embodiment 1 described above, the part of the third insulating film 105a that overlaps with the side surface of the photodiode 12, and the part of the third insulating film 105a provided outside the photodiode 12, are covered with the protection film 105b; the configuration of the protection film, however, is not limited to this configuration.

Figure 6:
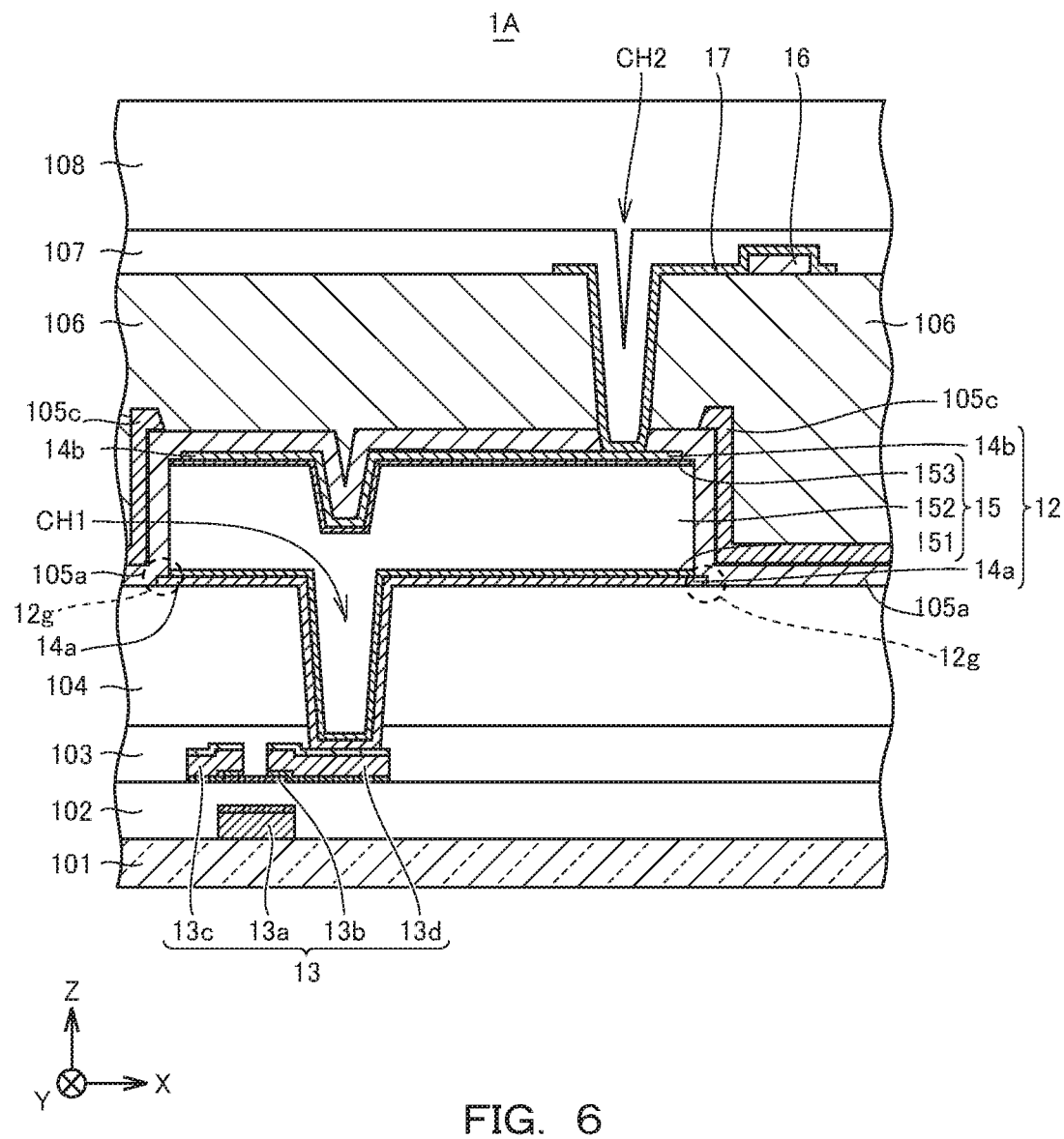
FIG. 6 is an enlarged cross-sectional view showing a part of a pixel part in Embodiment 2.

FIG. 6 is a schematic cross-sectional view showing a pixel portion of the active matrix substrate in the present embodiment. In FIG. 6, the configurations identical to those in Embodiment 1 are denoted by the same reference symbols as those in Embodiment 1. The following description principally describes configurations different from those in Embodiment 1.

As shown in FIG. 6, the active matrix substrate 1A includes a protection film 105c on the third insulating film 105a. The protection film 105c is made of the same material as that of the protection film 105b in Embodiment 1.

The protection film 105c covers the top of the third insulating film 105a that does not overlap with the upper electrode 14b when viewed in a plan view. In other words, the protection film 105c does not overlap with the upper electrode 14b when viewed in a plane view, and is in contact with the third insulating film 105a provided on the side surface of the photodiode 12 and in an area outside the photodiode 12. Though only one pixel portion is shown in FIG. 6 and the illustration of an adjacent pixel is omitted, the third insulating film 105a is provided continuously to an adjacent pixel, and the protection film 105c is provided continuously onto the third insulating film 105a on the adjacent pixel.

In the present embodiment as well, the third insulating film 105a and the protection film 105c are laminated on the side surface including the protrusion portion 12g of the photodiode 12. Therefore, supposing a case where there is a discontinuous part in the third insulating film 105a covering the protrusion portion 12g on the side surface of the photodiode 12, even if moisture permeates through a scar that occurs on a surface of the active matrix substrate 1A after the active matrix substrate 1A is produced, it is unlikely that moisture would permeate through the discontinuous part of the third insulating film 105a. Further, since the protection film 105c provided on the outer side of the photodiode 12 is provided continuously to an adjacent pixel, it is unlikely that moisture would get in through the interface between the protection film 105c and the third insulating film 105a, as compared with the configuration of Embodiment 1. This makes it more unlikely that leakage current of the photodiode 12 would flow, as compared with the configuration of Embodiment 1, resulting in higher reliability in the X-ray detection.

Figure 7:
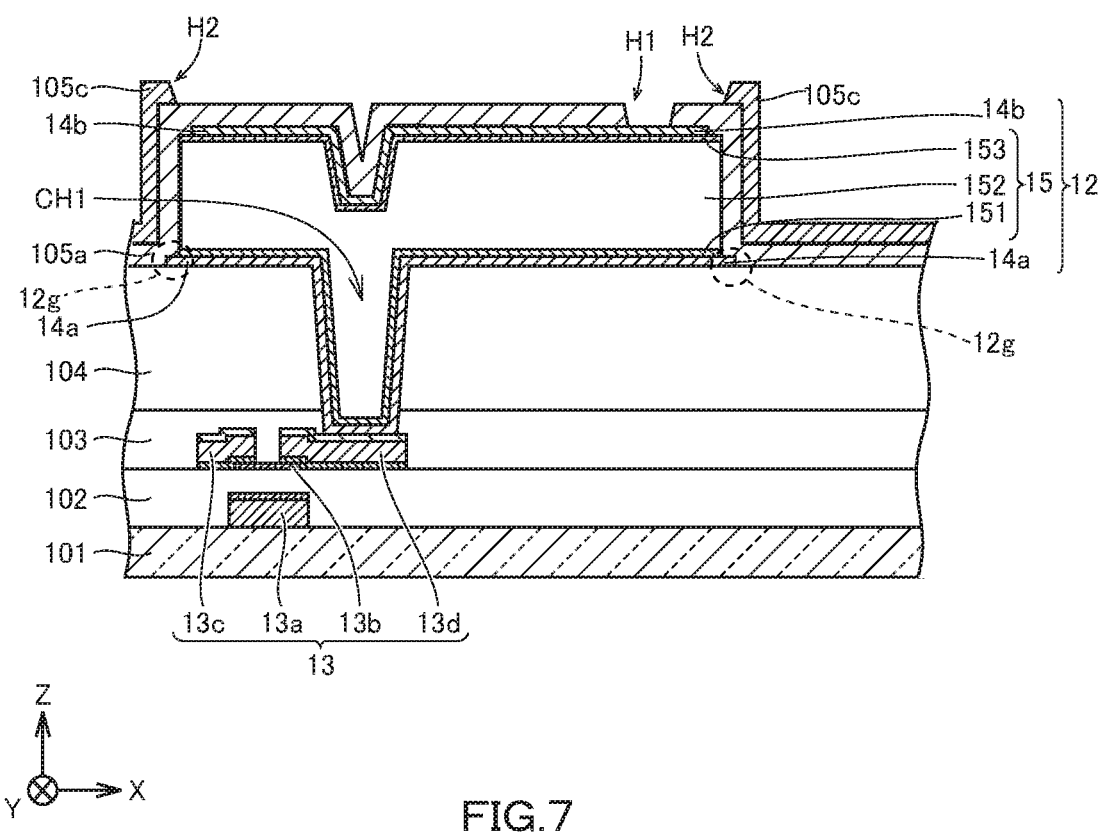
FIG. 7 is a cross-sectional view for showing a step of a process for producing the active matrix substrate shown in FIG. 6, the step being a step for forming the protection film shown in FIG. 6.
Figure 8A:
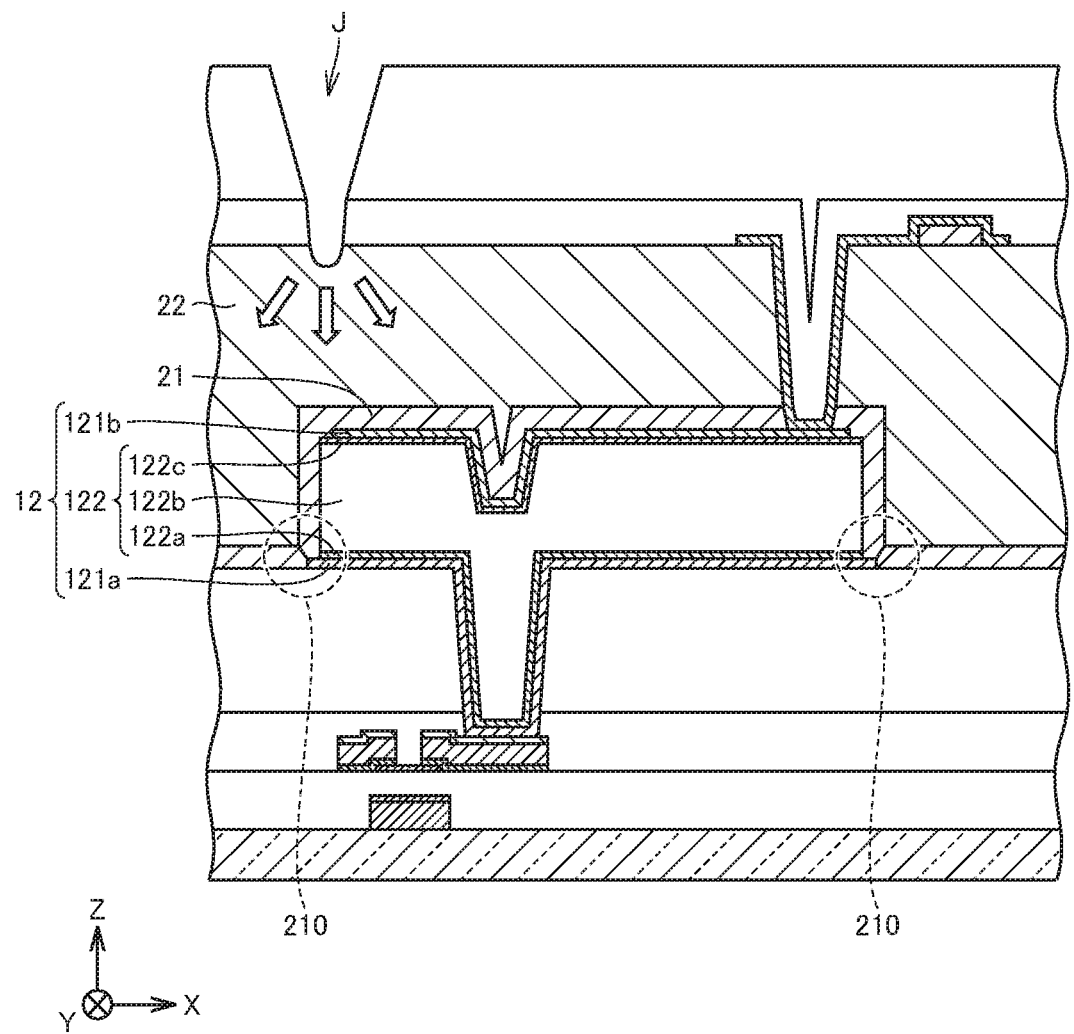
FIG. 8A is a cross-sectional view showing an exemplary structure of a conventional active matrix substrate used in an X-ray imaging device.
Figure 8B:
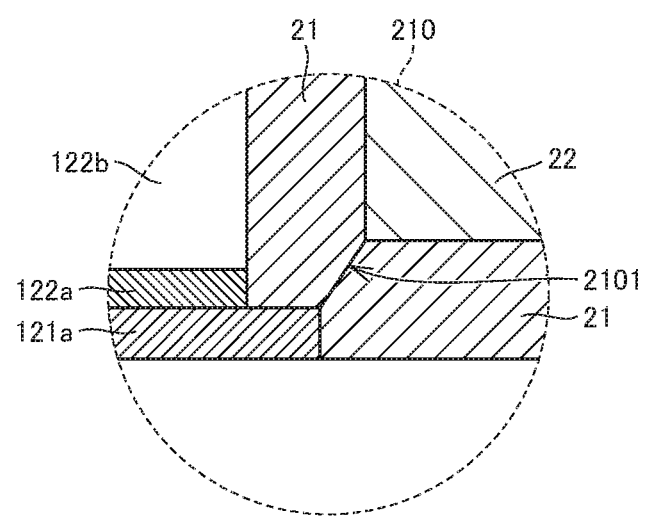
FIG. 8B is an enlarged cross-sectional view showing a part in a broken line frame 210 shown in FIG. 8A.

The active matrix substrate 1A in the present embodiment may be produced through the following process. First, the above-described steps shown in FIGS. 5A to 5K are performed. Thereafter, photolithography and wet etching are carried out so that the thin film 115 is patterned (see FIG. 7). In other words, a part of a thin film 105c that overlaps with the upper electrode 14b in FIG. 5K when viewed in a plan view is removed by etching. Through these steps, the protection film 105c is formed in an area on the third insulating film 105a that does not overlap with the upper electrode 14b when viewed in a plan view.

After the protection film 105c is formed, the steps similar to the above-described steps in Embodiment 1 shown in FIGS. 5M to 5T are carried out, whereby the active matrix substrate 1A (see FIG. 6) is produced.

Embodiments of the present invention are described above, but the above-described embodiments are merely examples for implementing the present invention. The present invention, therefore, is not limited to the above-described embodiments, and the above-described embodiments can be appropriately varied and implemented without departing from the spirit and scope of the invention.

(1) In Embodiments 1 and 2, the protection film 105b, 105c is not provided in an area that overlaps with the upper electrode 14b in the photodiode 12 when viewed in a plan view so that the ratio of transmission of scintillation light entering the pixels should not decrease. In a case where a transparent material such as IZO that would not impair the transmittance of the pixels is used for forming the protection film 105b, 105c, the protection film 105b, 105c may be provided in a part of an area that overlaps with the upper electrode 14b when viewed in a plan view. In other words, the protection film 105b, 105c may be provided at least so as to overlap with the third insulating film 105a in contact with the side surface of the photodiode 12, and the arrangement of the protection film 105b, 105c in an area other than the side surface part of the photodiode 12 is not limited.

The invention claimed is:
1. An active matrix substrate comprising:
a plurality of pixels, wherein
each of the plurality of pixels includes:

a photoelectric conversion element that includes a first electrode and a second electrode, and a semiconductor layer interposed between the first electrode and the second electrode, the first electrode being positioned on a light incident side of the photoelectric conversion element;

an inorganic film;

a protection film that has corrosion resistance against moisture;

an organic film that covers the inorganic film and the protection film;

a bias line that supplies a bias voltage for the photoelectric conversion element; and a conductive film that electrically connects the bias line and the first electrode of the photoelectric conversion element via a contact hole penetrating the organic film, the inorganic film covers an entire surface of the first electrode except an area that contacts the conductive film in a bottom of the contact hole, and a side surface of the photoelectric conversion element, and the protection film covers a portion of the inorganic film that overlaps with the side surface of the photoelectric conversion element.

2. The active matrix substrate according to claim 1, wherein an end of the second electrode protrudes with respect to a side surface of the semiconductor layer.

3. The active matrix substrate according to claim 1, wherein
the protection film does not overlap with the first electrode in the photoelectric conversion element when viewed in a plan view.

4. The active matrix substrate according to claim 1, wherein
the inorganic film is provided continuously over the plurality of pixels, and
the protection film is provided continuously over the inorganic film provided over the plurality of pixels.

5. The active matrix substrate according to claim 1, wherein the protection film is made of a conductive material.

6. The active matrix substrate according to claim 1, wherein the protection film is made of an insulating material.

7. An X-ray imaging panel comprising:
the active matrix substrate according to claim 1; and
a scintillator that convers irradiated X-rays into scintillation light.

* * * * *